United States Patent [19]
Jain et al.

[11] Patent Number: 6,086,626
[45] Date of Patent: Jul. 11, 2000

[54] METHOD FOR VERIFICATION OF COMBINATIONAL CIRCUITS USING A FILTERING ORIENTED APPROACH

[75] Inventors: Jawahar Jain, Santa Clara; Rajarshi Mukherjee, San Jose, both of Calif.; Koichiro Takayama, Tokyo, Japan

[73] Assignee: Fijutsu Limited, Kanagawa, Japan

[21] Appl. No.: 08/857,916

[22] Filed: May 16, 1997

[51] Int. Cl.[7] .................................................... G06F 17/50
[52] U.S. Cl. ........................................ 716/5; 716/2; 716/7
[58] Field of Search ........................ 395/500.06, 500.03, 395/500.08

[56] References Cited

U.S. PATENT DOCUMENTS

| 5,243,538 | 9/1993 | Okuzawa et al. | 395/500.06 |
| 5,469,367 | 11/1995 | Puri et al. | 395/500.08 |
| 5,649,165 | 7/1997 | Jain et al. | 395/500.06 |
| 5,671,399 | 9/1997 | Meier | 395/500.06 |
| 5,787,006 | 7/1998 | Chevallier et al. | 395/500.06 |

OTHER PUBLICATIONS

Bryant, R. E. et al, "Verification of Arithmetic Circuits with Binary Moment Diagrams", 32nd Design Automation Conference, Proceedings 1995 (IEEE Cat. No. 95CH35812), Proceedings of the 32nd Design Automation Conference, San Francisco, CA, USA, Jun. 12–16, 1995, pp. 535–541, XP000546358 1995, New York, NY, USA, ACM, USA ISBN: 0–89791–725–1.

Chen, Y. et al., "ACV: An Arithmetic Circuit Verifier", 1996 IEEE/ACM International Conference on Computer–Aided Design, Digest of Technical Papers (Cat. No. 96CB35991), Proceedings of International Conference on Computer Aided Design, San Jose, CA, USA, Nov. 10–14, 1996, pp. 361–365, XP000738433 1996, Los Alamitos, CA, USA, IEEE Comput. Soc. Press, USA, ISBN: 0–8186–7597–7.

Jain J. et al., "Formal Verification of Combinational Circuits", Proceedings Tenth International conference on VLSI Design (Cat. No. 97TB100095), Proceedings Tenth International Conference on VLSI Design, Hyderabad, India, Jan 4–7, 1997, pp. 218–225, XP002120998 1997, Los Alamitos, CA, USA, IEEE Comput. Soc. Press, USA ISBN: 0–8186–7755–4.

Matsunga, Y., "An Efficient Equivalence Checker for Combinational Circuits" 33rd Design Automation Conference, Proceedings 1996 (IEEE Cat. No. 96CH35932), Proceedings of 33rd Design Automation conference, Las Vegas, NV, USA, Jun. 3–7, 1996, pp. 629–634, XP002120999 1996, New York, NY, USA, ACM, USA ISBN: 0–89791–779–0.

(List continued on next page.)

Primary Examiner—Paul R. Lintz
Assistant Examiner—Leigh Marie Garbowski
Attorney, Agent, or Firm—Christie, Parker & Hale, LLP

[57] ABSTRACT

A set of filters are arranged in sequence for verification and analysis of digital circuit designs. The filters are either active filters, which are directly involved in verification of circuit designs (e.g., a Binary Decision Diagram (BDD)-based verifier or an automatic test pattern generation (ATPG)-based verifier), or passive filters, which gather information about the circuit or transform the circuit structure in order to simplify the verification problem (e.g., random pattern simulation or circuit partitioning). Given a pair of circuits to be verified, the filter approach first subjects the circuits to very simple, fast techniques having very low memory usage requirements. These steps are followed by a series of increasingly powerful methods that are more time consuming and often require more computer memory for their operation. In between the simpler active filters and the more sophisticated active filters, information about potential equivalent nodes in the circuits is collected and a decision is made as to whether to partition the circuits. The verification methodology is structured such that circuit designs that are easier to verify are never unnecessarily subjected to more expensive techniques. The method provides for a gradual increase in the sophistication of verification techniques applied, according to the difficulty of the verification problem.

52 Claims, 14 Drawing Sheets

OTHER PUBLICATIONS

Muhkerjee, R. et al., "Efficient Combinational Verification using BDDs and a Hash Table", Proceedings of 1997 IEEE International Symposium on Circuits and Systems, Circuits and Systems in the Information Age, ISCAS '97 (Cat. No. 97CH35987), Proceedings of 1997 IEEE International Symposium on Circuits and Systems, pp. 1025–1028, vol. 2, XP002120997, 1997, New York, NY, USA, IEEE, USA, ISBN: 0–7803–3583–X.

European Patent Office Search Report Communication, Nov. 11, 1999, pp. 1–5.

R. Rudell, "Dynamic Variable Ordering for Ordered Binary Decision Diagrams", IEEE, 1993, pp. 42–47.

M. Fujita, et al., "Evaluation and Improvements of Boolean Comparison Method Based on Binary Decision Diagrams", IEEE, 1988, pp. 2–5.

C. Berman, et al., "Functional Comparison of Logic Designs for VLSI Circuits", IEEE, 1989, pp. 456–459.

R. Bryant, "Graph–Based Algorithims for Boolean Function Manipulation", IEEE Transactions on Computers, Aug. 1986, vol. C–35, No. 8, pp. 677–691.

W. Kunz, "Hannibal: An Efficient Tool for Logic Verification Based on Recursive Learning", IEEE, 1993, pp. 538–543.

S. Malik, et al., "Logic Verification Using Binary Decision Diagrams in a Logic Synthesis Environment", IEEE, 1988, pp. 6–9.

E. Cerney, et al., "Tautology Checking Using Cross–Controllability and Cross–Observability Relations", IEEE, 1990, pp. 34–37.

D. Brand, "Verification of Large Synthesized Designs", IEEE, 1993, pp. 534–537.

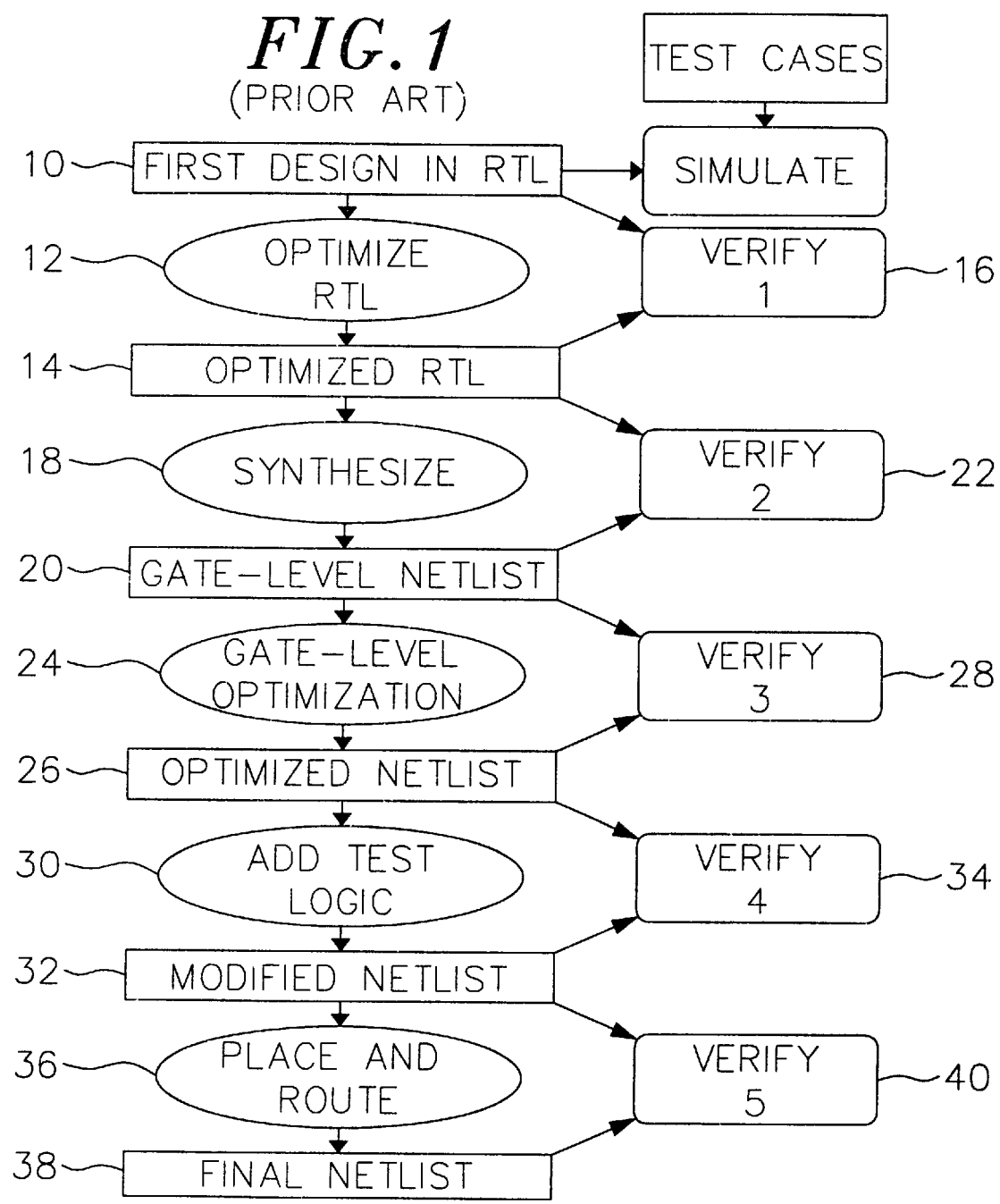

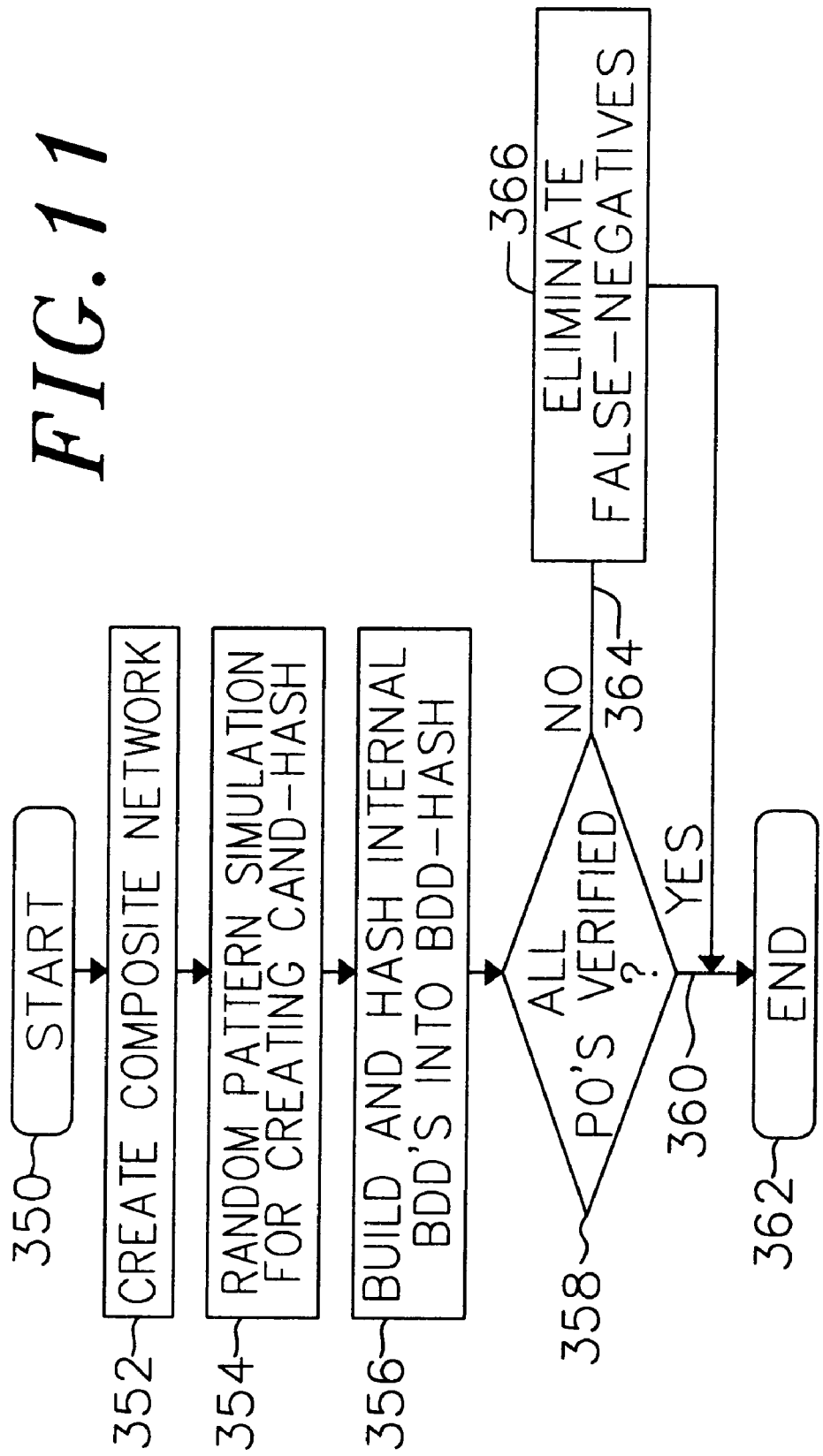

METHOD FOR VERIFICATION OF COMBINATIONAL CIRCUITS USING A FILTERING ORIENTED APPROACH

BACKGROUND OF THE INVENTION

This invention relates generally to the field of computer-aided design (CAD) systems and methods, and more specifically to methods used for digital circuit design and verification.

Successful design of a complex digital system requires verifying the correctness of the implementation with respect to its intended functionality. Traditionally, the task of design validation is carried out by means of simulation. In a simulation based approach, the designer needs to create a complete set of test vectors which represent all possible inputs to the system. The outputs for each of these test vectors are analyzed to guarantee the correctness of the design. This process is highly Central Processing Unit (CPU) time intensive; in almost all practical situations it is not feasible to exhaustively simulate a design to guarantee its correctness.

Due to the limitations of a simulation based approach, various formal verification strategies are becoming increasingly popular. By using these techniques, it is possible to guarantee the correctness of a design under all possible input combinations.

The process of designing a complex system usually starts with an abstract model of the system. This model is subjected to extensive simulation after which it becomes the "golden specification" of the design. From this abstract model, a detailed implementation is derived in a hierarchical manner. First the abstract model is translated into a synthesizable, behavioral Register Transfer Level (RTL) model representing the block structure behavior of the design. This behavioral RTL model is then translated into a structural model which is a logic level description of the system. From the structural RTL model a transistor netlist and subsequently the physical layout of the design are derived.

In a successful design methodology, it is essential to catch design errors early in the design cycle. To achieve this goal, the functionality of the design is verified at every level of the design cycle hierarchy against a design specification from the previous level. This kind of formal verification in which different implementations of the same design are compared to check their equivalence is known as implementation verification. FIG. 1 is a prior art flow diagram of a typical verification effort. Note that the verification effort may be carried out in parallel with the design effort. The typical verification effort starts by verifying the first implementation against the original specification. Once an implementation has been verified successfully, it becomes the specification for the next implementation, which is typically derived by optimizing the previous implementation. The first or original design is represented as RTL design 10 and optimized 12 to produce optimized RTL design 14. The optimized RTL is verified against the first RTL by verify 1 16. The optimized RTL is synthesized 18 to produce a gate-level netlist 20. The gate-level netlist is verified against the optimized RTL by verify 2 22. The gate-level netlist is optimized 24 to produce an optimized netlist. The optimized netlist is verified against the gate-level netlist by verify 3 28. Next, test logic is added 30 to the optimized netlist to create a modified netlist 32. The modified netlist is verified against the optimized netlist by verify 4 34. The modified netlist is placed and routed 36 to produce a final netlist 38. Finally, the final netlist is verified against the modified netlist by verify 5 40.

Implementation verification typically proceeds in two phases. In the first phase, a Boolean network representing the original design is extracted from the RTL description or the gate-level netlist. In the second phase, the correctness of this Boolean network is verified using formal methods.

Current research is focused on making advances in the area of verifying the equivalence of two Boolean networks. More specifically, research is focused on the verification of combinational circuits, i.e., circuits in which the outputs depend only on the current inputs (as opposed to sequential circuits in which the outputs depend not only on the present inputs but also on the past sequence of inputs). Some sequential verification problems can be reduced to a combinational verification problem (e.g., when the corresponding latches in the two designs can be identified). Although techniques exist for verifying general sequential circuits, it is not practical with current technology to verify large complex circuit designs using the techniques.

The combinational verification problem can be stated as follows. Given two Boolean netlists, check if the corresponding outputs of the two circuits are equal for all possible inputs. This problem is NP-hard and hence a general solution which can handle arbitrary Boolean functions is not likely to exist. However, since the functions that are implemented in the circuit design in practice are not random Boolean functions, various techniques have been developed which can successfully verify large designs.

The work in combinational equivalence checking can be classified into two main categories. The first approach consists of representing the output functions of the two networks using a unique (i.e. canonical) representation. Two circuits are equivalent if and only if the canonical representations of the corresponding outputs are the same. The most popular canonical representations are based on Binary Decision Diagrams (BDDs). In the worst case, these methods can require exponential space (in terms of the number of inputs).

The second approach consists of identifying equivalent points and implications between the two circuits. Using this information, the process of equivalence checking can be simplified. Since a typical design proceeds by a series of local changes, in most cases there are a large number of implications between the two circuits to be verified. These implication based techniques have been very successful in verifying large circuits and form the basis of most combinational verification systems.

Most current methods for combinational verification are based on a single "core" verification technique such as OBDDs, automatic test pattern generation (ATPG), learning etc. A core verification technique is a technique that is capable by itself to verify a circuit or prove tautology or satisfiability of some Boolean formula given enough time and space. A core verification technique is also known as a complete analysis technique, that is, a technique that is capable by itself to prove tautology or satisfiability of some Boolean formula given enough time and space. In contrast, a supporting analysis technique is a technique that, when used by itself, can detect tautology or satisfiability of some but not all Boolean formulas even when given enough time and space. Due to the NP-hard complexity of the verification problem, it is expected that a single core verification technique will not perform well on a wide range of circuits. In addition, the nature of any given verification problem is not known a priori. This uncertainty is further worsened in some verification techniques because the entire verification problem may be broken down into even more (though smaller) verification problems. Thus, there is a need for methods which can employ different core verification techniques automatically, with minimal overhead in switching from one technique to the other, while sharing the results of the previously applied techniques, and which provide verification results when any one or more of the techniques can be successful.

SUMMARY OF THE INVENTION

The present invention is a filter based combinational circuit verification system having a set of complete verification techniques along with a set of supporting techniques, arranged sequentially, each determining the result of verification or altering the circuit data structure, and executed until a predetermined set of constraints on the computer memory usage and/or the computer execution time usage are exceeded, and providing the final verification result, or the resultant altered circuit data structure, to the subsequent complete verification techniques, or supporting techniques, until the result of the circuit verification is determined.

In the present invention, a set of filters are arranged in sequence for verification of digital circuit designs. The filters are either active filters, which are directly involved in verification of circuit designs (e.g., a Binary Decision Diagram (BDD)-based verifier or an automatic test pattern generation (ATPG)-based verifier), or passive filters (e.g., random pattern simulation or circuit partitioning), which gather information about the circuit or transform the circuit structure in order to simplify the verification problem. Given a pair of circuits to be verified, the filter approach first subjects the circuits to very simple, fast techniques with very low memory usage requirements. These steps are followed by a series of increasingly powerful methods that are more time consuming and often require more computer memory for their operation. In between the simpler active filters and the more sophisticated active filters, information about potential equivalent nodes in the circuits is collected and a decision is made as to whether to partition the circuit. The verification methodology is structured such that circuit designs that are easier to verify are never unnecessarily subjected to more expensive techniques. The method provides for a gradual increase in the sophistication of verification techniques applied, according to the difficulty of the verification problem.

In an embodiment of the present invention, the system performs analysis of circuit properties which depends on testing of Boolean satisfiability or Boolean tautology of any Boolean expression such as: (A) Determination of existence or absence of a fault in the fabricated digital circuit; (B) Determination of any constraints on the "timing"; (C) Minimum cost "engineering change" solutions; (D) Determination of correctness of any sequential (time dependent) circuit (including application to model checking methods); (E) Or any such digital circuit property.

An embodiment of the present invention is a filter based combinational circuit analysis system having a set of complete analysis techniques and a set of supporting techniques arranged sequentially, each determining the analysis result or altering the circuit data structure, and providing a final analysis result or the resultant altered circuit data structure to the subsequent complete analysis techniques, until the result of the circuit analysis is determined.

It is important to note that an advantage of the present invention is that it is easily extensible. The filter framework can be extended or augmented by adding new verification techniques. A new technique may be added at appropriate places in the filter framework depending on the strength of the new technique and how it compares to the relative strength or weakness of the other techniques which have already been included in the filter. For example, techniques such as Boolean Expression Diagrams (BEDs) may be included to extend the filter arrangement of the present invention by adding the BEDs technique after automatics test pattern generation (ATPG) verification in the micro-filter of the verification core. Alternatively, the BEDs technique may be executed after smart cutset based verification in the micro-filter. Similarly, if another new technique is proposed or discovered, then the new technique can be also inserted in an appropriate place in the filter arrangement. Thus, the entire verification software system does not need to be redeveloped. This extensibility feature of the present invention is an important advantage to the filter oriented approach.

Still other embodiments of the present invention will become readily apparent to those skilled in the art from the following detailed description, wherein is shown and described only embodiments of the invention by way of illustration of the best modes contemplated for carrying out the invention. As will be realized, the invention is capable of other and different embodiments and its several details are capable of modification in various obvious respects, all without departing from the spirit and scope of the present invention. Accordingly, the drawings and detailed description are to be regarded as illustrative in nature and not as restrictive.

DESCRIPTION OF THE DRAWINGS

FIG. 1 is a flow diagram of a typical verification effort (Prior Art).

FIG. 11 is a flow diagram of verification using the BDD hash technique.

DETAILED DESCRIPTION OF THE INVENTION

Figure 2A:
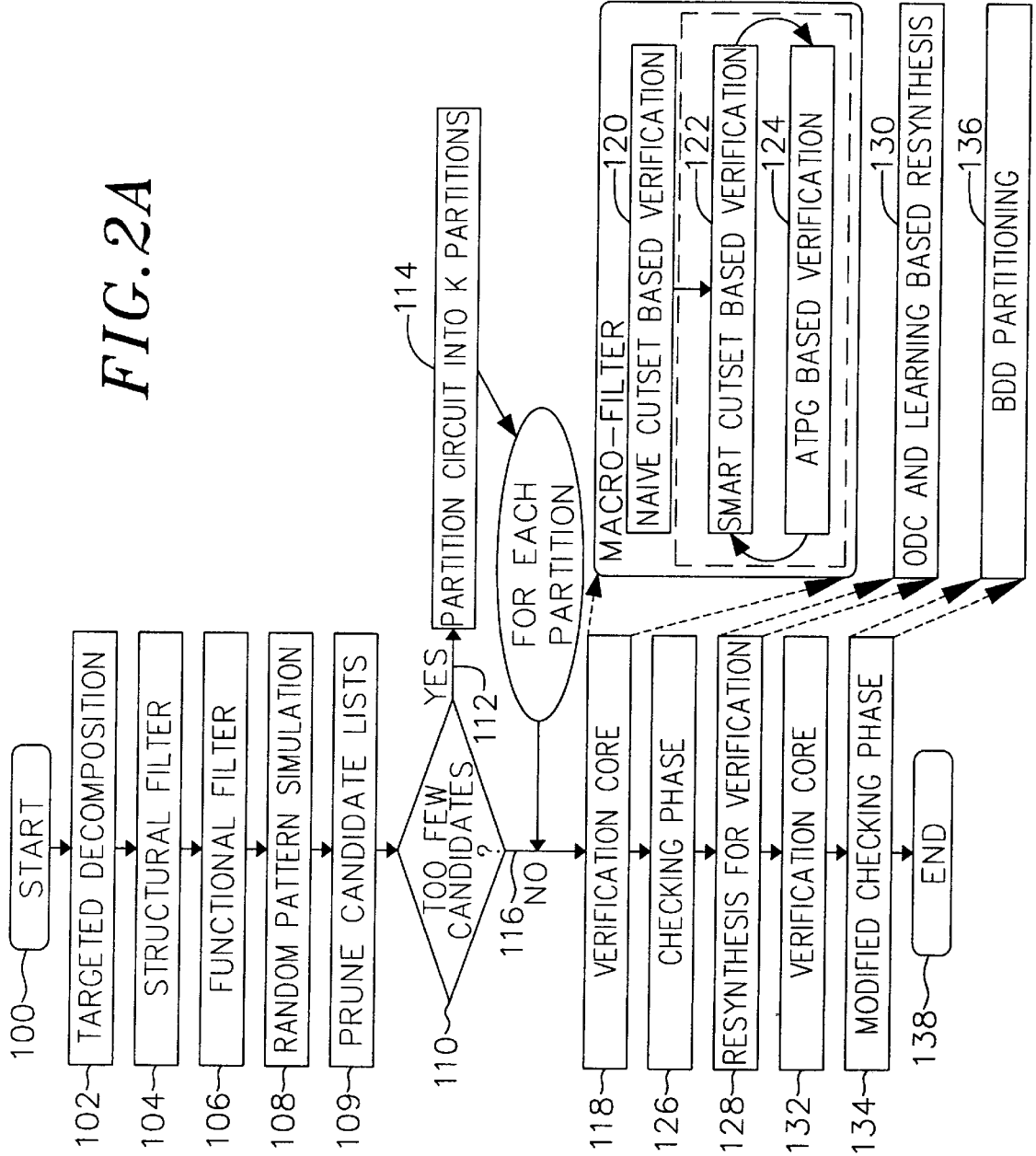
FIG. 2A is a flow diagram of the filter approach of the present invention.
Figure 2B:
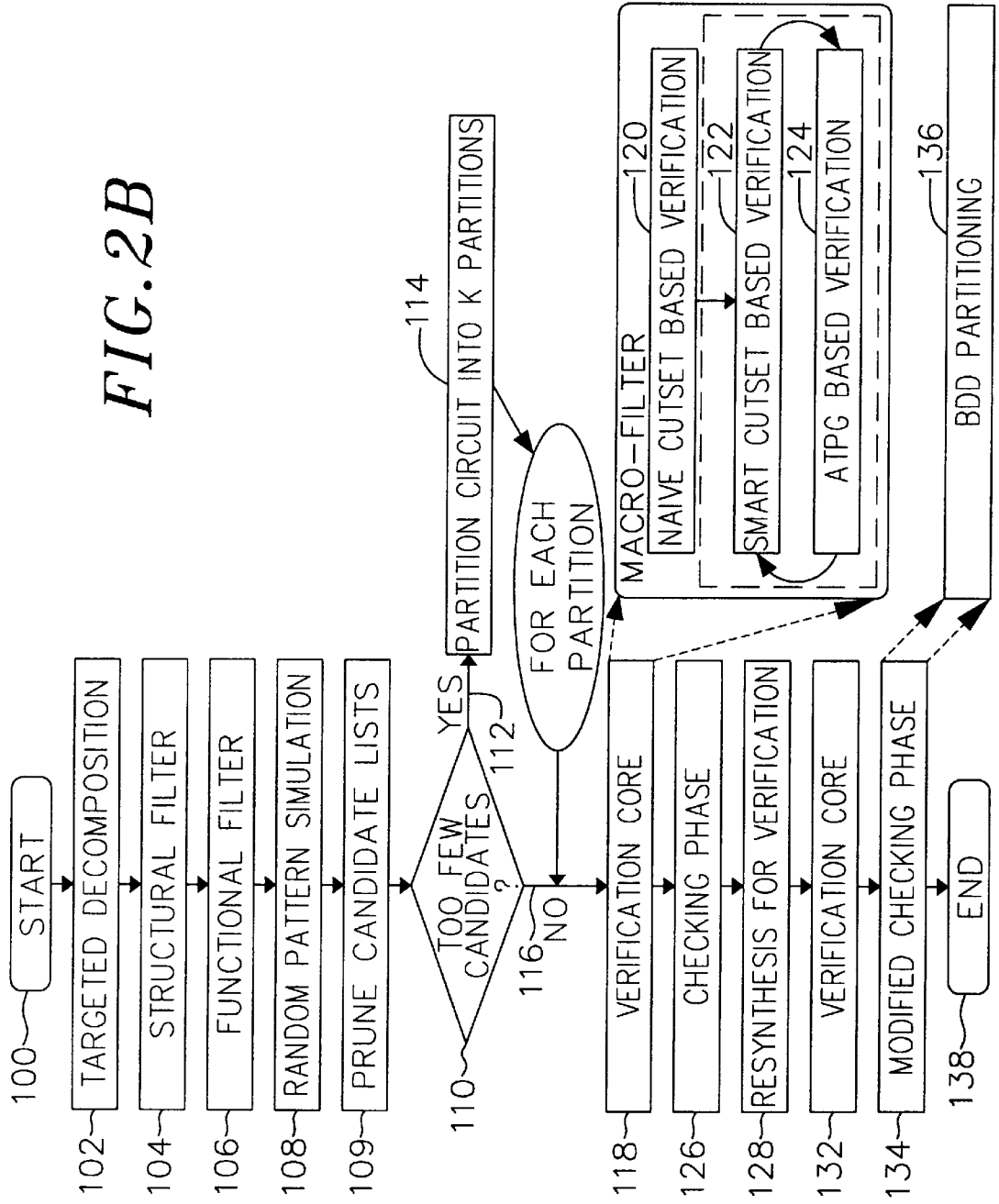
FIG. 2B is a flow diagram of an alternate embodiment of the filter approach of the present invention.

I. A Filter Oriented Approach to Verification
A. Definitions

Cutset: A cutset in the transitive fan-in (TFI) of a node v in a network N is a set $S=\{v_1, v_2, \ldots v_k\}$ of nodes such that any path from the primary inputs to v must pass through a node $v_i$ in S. The size of the cutset is k.

Direct Implication: Given an initial assignment of Boolean values to some nodes in a circuit N, the process of determining the Boolean values at other nodes in N using only the connectivity of the nodes and their corresponding truth tables is called direct implication.

Indirect Implication: An indirect implication is a relation between Boolean values at two nodes that cannot be derived by only direct implication unless the law of contrapositum is used. The process of deriving indirect implications is called learning.

Weaker Technique: On a given computer system, a technique A is called a weaker technique than technique B when the empirical examination on the set of circuits used to benchmark performance of verification procedures, and thought to represent the sample set of circuits similar to the circuits which may be given to the present invention for verification, reveals that the time/space requirements of technique A is less than the time/space requirement of technique B, and technique A can solve a larger number of cases than technique B.

Complete Verification Technique: A technique that is capable by itself to verify a pair of circuits given enough time and space.

Complete Analysis Technique: A technique that is capable by itself to prove tautology or satisfiability of some Boolean formula given enough time and space.

Supporting Verification Technique: A technique that when used by itself, can detect verification of some but not all Boolean formulas in a pair of circuits even when given a reasonable time and space.

Supporting Analysis Technique: A technique that when used by itself, can detect tautology or satisfiability of some but not all Boolean formulas even when given enough time and space.

Circuit Property: determination of existence or absence of a fault in the fabricated digital circuit, determination of any constraints on the timing, minimum cost engineering change solution, determination of correctness of any sequential (time dependent) circuit, or any such digital circuit property which depends on testing of Boolean satisfiability or Boolean tautology of any Boolean expression.

The terms network and circuit, gate and node, and OBDD and BDD (to represent ordered binary decision diagrams) are used interchangeably herein.

B. Overview

The present invention consists of a set of filters arranged in sequence. The filters are of two types: (1) active filters, which are directly involved in verification of circuit designs (e.g., a BDD-based verifier or an ATPG-based verifier), and (2) passive filters, which gather information about the circuit or transform the circuit structure in order to simplify the verification problem (e.g., random pattern simulation or circuit partitioning).

Given a pair of circuits $N_1$, $N_2$ to be verified, the filter approach of the present invention first subjects the pair to very simple, fast techniques which have very low memory usage requirements. These steps are followed by a series of increasingly powerful methods that are more time consuming and often require more computer memory for their operation. In between the simpler active filters and the more sophisticated active filters there is a stage that collects information about potential equivalent nodes in the circuit and decides whether to partition the circuit. It is important to note that the present verification methodology is structured in a way such that circuit designs that are easier to verify are never unnecessarily subjected to more expensive techniques such as learning. The present framework provides for a gradual increase in the sophistication (and therefore the computational cost) of verification techniques applied, according to the difficulty of the verification problem. The present invention thus allows for a graceful degradation of overall verification performance.

FIG. 2A is a flow diagram of the filter approach of the present invention. Given two networks $N_1$ and $N_2$, a composite network, $N_C$, is created by joining corresponding primary inputs of $N_1$ and $N_2$. The combinational verifier is invoked on $N_C$. The entire verifier proceeds by verifying pairs of internal nodes in the circuit. All equivalent nodes are merged. The first two filters in the verifier, the Structural Filter and the Functional Filter, are fast filters with low computation cost. These filters identify the easy internal equivalences in $N_C$ at a very low computational cost. These internal equivalences could be identified by the subsequent filters as well. However, identifying these internal equivalences by the subsequent filters would be substantially more expensive in terms of the computational resources required. Next, random pattern simulation is used to identify pairs of nodes which could be functionally equivalent. If such candidates are few in number, the circuit is partitioned to create more candidates and to simplify the verification effort. Next, BDD-based filters and an ATPG-based filter are invoked to verify a majority of the candidates. These filters constitute the verification core (VC) of the verifier. All remaining verification instances are deemed hard. Two filters which re-synthesize the circuit and partition all large BDDs, respectively, are employed for their verification. Each filter in the proposed verification methodology is described in detail below.

After Start step 100, the networks to be verified are technology decomposed using targeted decomposition 102. The purpose of the decomposition process is to decompose complex gates in the circuit into sets of simpler primitive gates such that many candidates for equivalence are created. The problems are passed to separate filters in series. Each filter consists of a different verification method. Each filter will solve some of the problems and each successive filter in the sequence typically works on solving a smaller number of verification problems than the previous filter. The last filter in the sequence solves any remaining problems. At any point in the series, verification processing can be halted if all problems are solved. In prior art systems, only one, two, or at most, three verification techniques (i.e., filters) are used to solve the verification problem. The present invention passes the verification problems through multiple filters as needed to obtain a verification solution. The particular arrangement of verification techniques in the sequence is very important for optimum performance.

At step 104, a Structural Filter is applied to the networks. At step 106, a Functional Filter is applied to the networks. Next, Random Pattern Generation 108 is used to simulate the networks. At step 109, candidate lists of internal gates for verification are pruned. At test step 110, if there are too few candidates for verification, then Yes path 112 is taken to step 114. At step 114, the circuit being verified is partitioned into K partitions. The goal of this step is to create more equivalences among gates in each partition of the circuit design.

Steps 118 through 136 are then performed for each partition. If there were enough candidates for verification at test step 110, then No path 116 is taken to step 118. Processing continues for each partition with the Verification Core 118. The Verification Core comprises three separate filters designated as a "macro filter". These filters include a Naive Cutset-Based Verification 120, a Smart Cutset-Based Verification 122, and an ATPG-Based Verification 124. The Smart Cutset-Based Verification and the ATPG-Based Verification are processed in a loop arrangement to provide a more effective verification to converge upon a solution.

After Checking Phase 126, the networks are processed by Resynthesis For Verification 128. This step includes ODC and Learning Based Resynthesis 130. The networks are then sent through the Verification Core 132. Finally, the networks are processed by Modified Checking Phase 134, which includes BDD Partitioning 136, before verification processing ends at End step 138. Each of the above steps are described in further detail below.

Figure 2C:
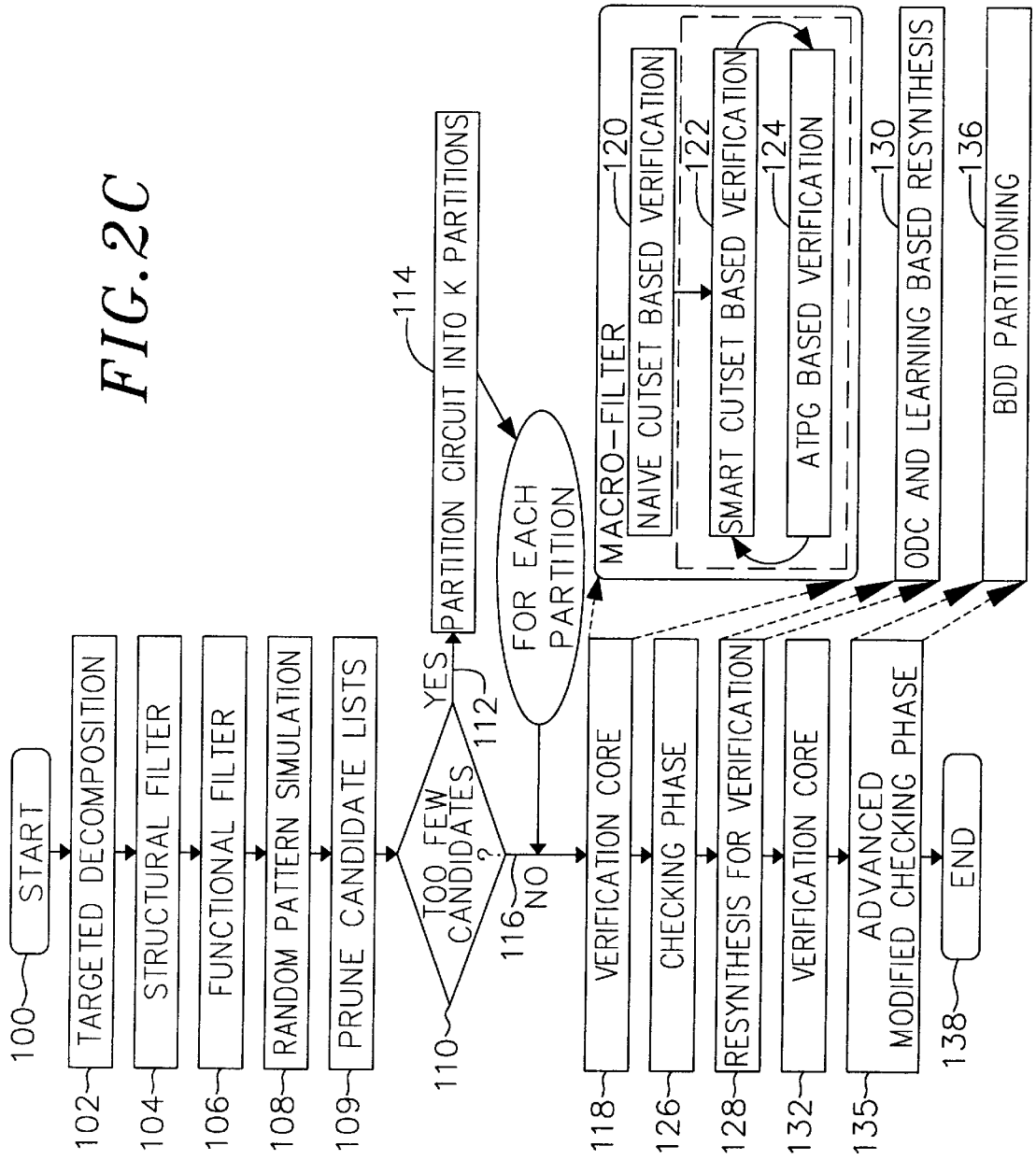
FIG. 2C is a flow diagram of an alternate embodiment of the filter approach of the present invention.
Figure 3:
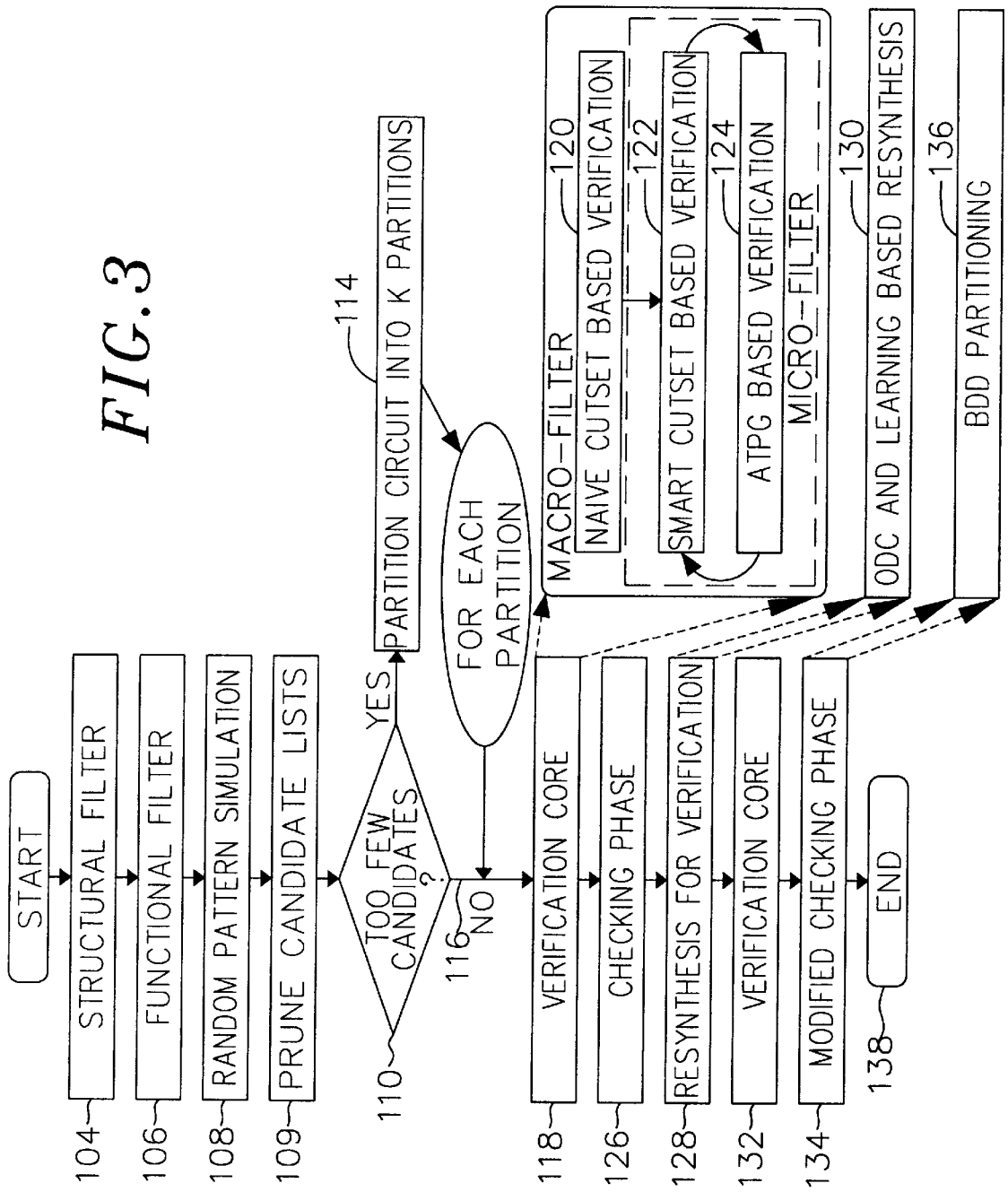
FIG. 3 is a flow diagram of an alternate embodiment of the filter approach of the present invention.
Figure 4:
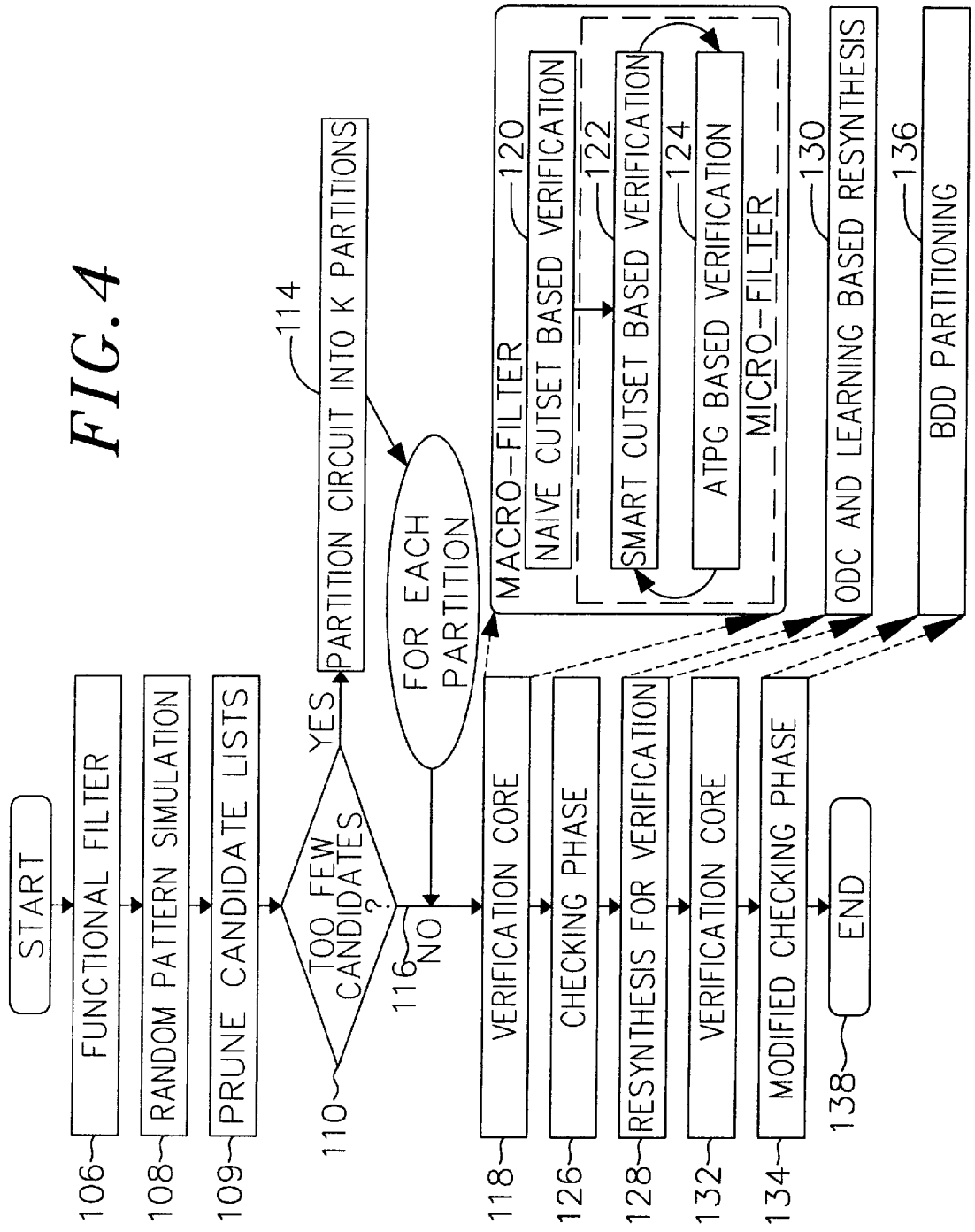
FIG. 4 is a flow diagram of an alternate embodiment of the filter approach of the present invention.
Figure 5:
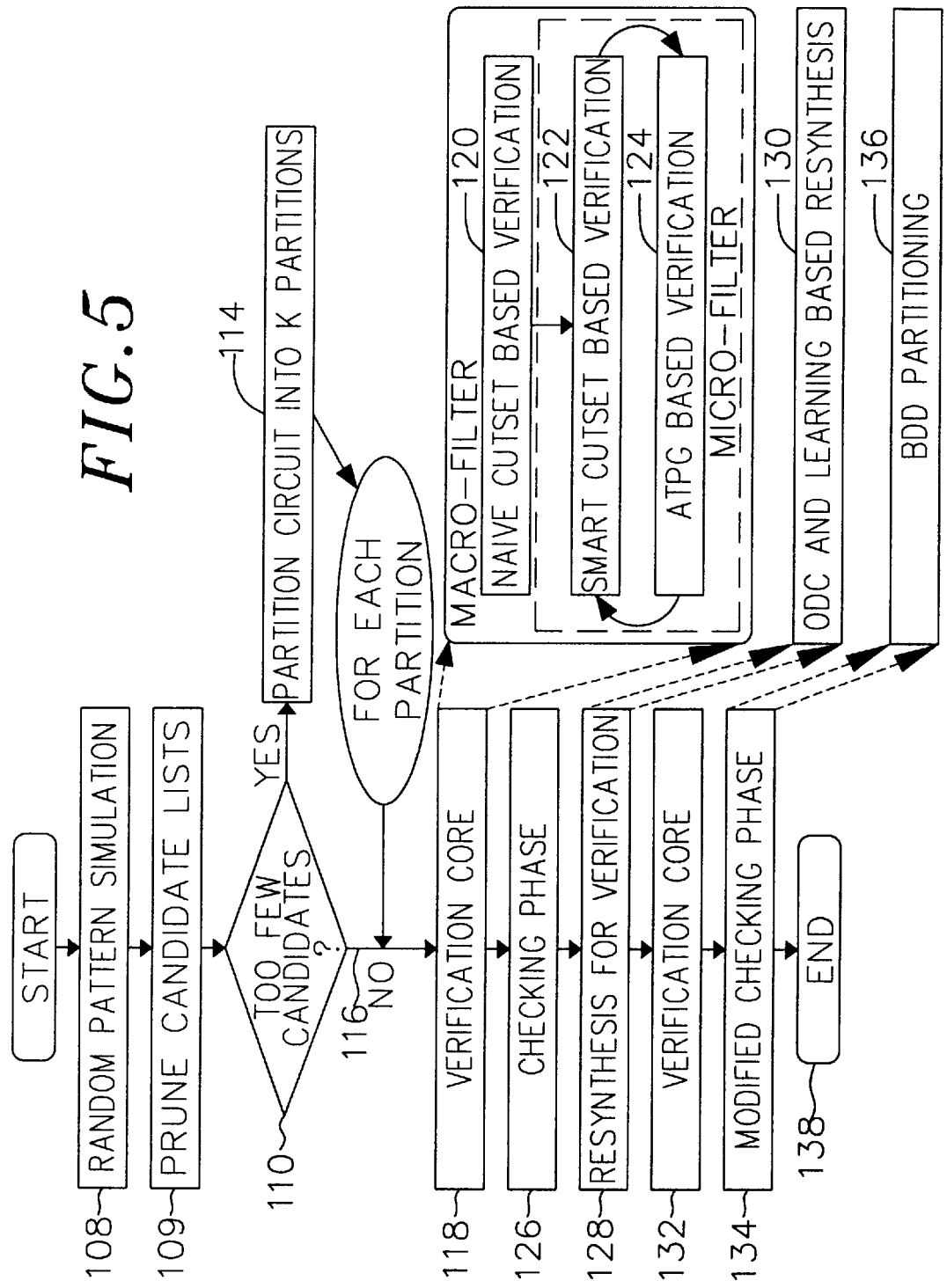
FIG. 5 is a flow diagram of an alternate embodiment of the filter approach of the present invention.
Figure 6:
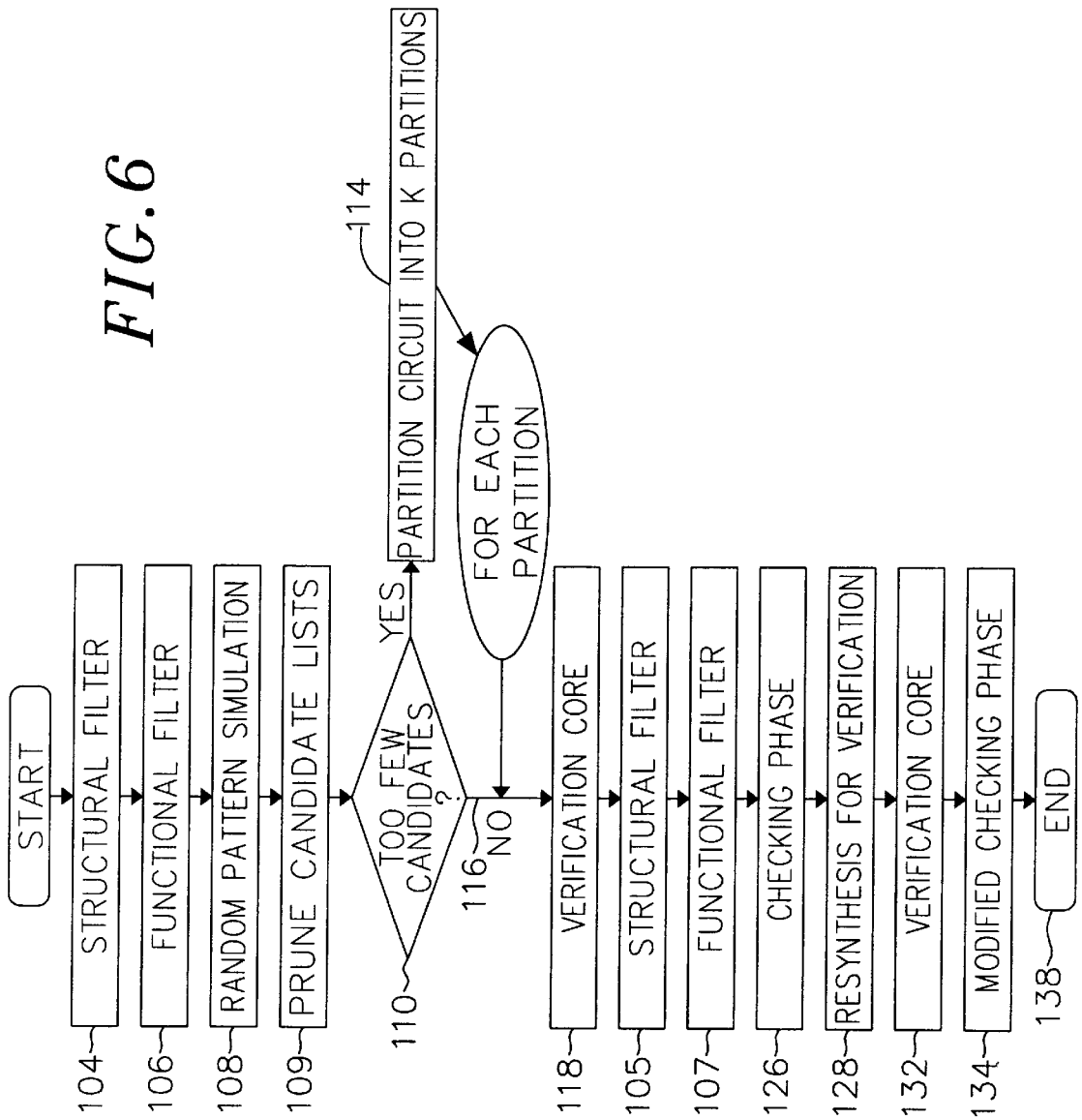
FIG. 6 is a flow diagram of an alternate embodiment of the filter approach of the present invention.
Figure 7:
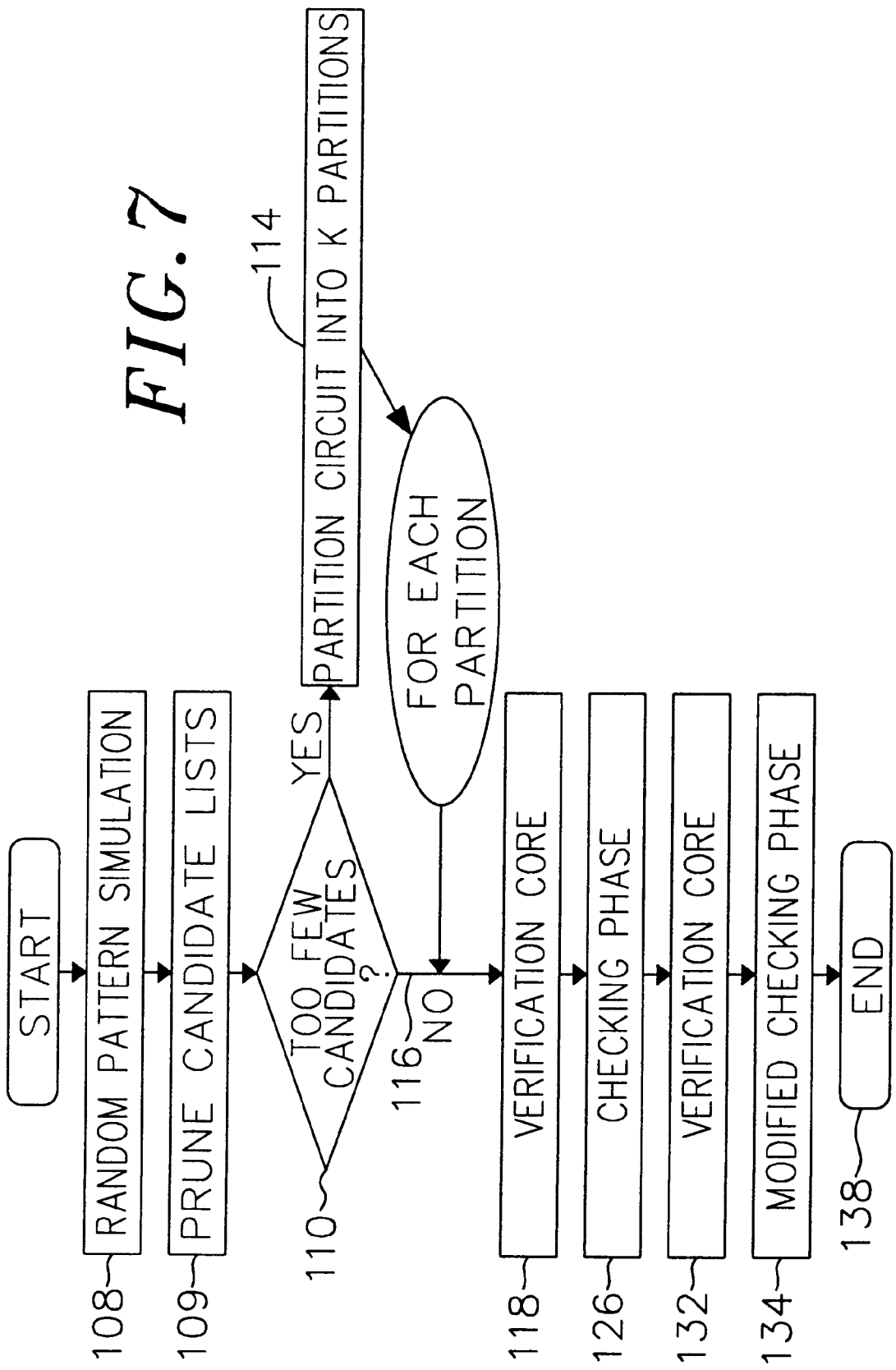
FIG. 7 is a flow diagram of an alternate embodiment of the filter approach of the present invention.

In an alternate embodiment as shown in FIG. 2C, the Modified Checking Phase 134 is replaced by an Advanced Modified Checking Phase 135. Modified Checking Phase 134 refers to a process which is identical to the Checking Phase 126, but where if the BDDs "blow-up", then the BDDs are broken into smaller BDDs using BDD Partitioning 136. As another useful embodiment, circuit partitioning (not shown) can be introduced along with BDD Partitioning 136 at this stage of the process. This combination is called Advanced Modified Checking Phase 135 (as shown on FIG. 2C). In Advanced Modified Checking Phase 135, for each verification problem which was given to Modified Checking Phase 134, the circuit is split into several partitions by splitting using input variables or internal variables. Then for each such partitioned circuit, all of the steps from block 108 to block 136 are applied.

Although FIG. 2A describes one embodiment of the filter-based verification system, several alternate configurations are possible. For example, ODC and Learning Based Resynthesis or Resynthesis for Verification filter 128 could be omitted. Alternatively, Structural Filter 104 and/or Functional Filter 106 could be applied after every filter. Similarly, one can choose to change the configuration inside the Verification Core filter 118 and use only Smart Cutset Based Verification 122 and ATPG Based Verification 124, or use Native Cutset Based Verification 120 followed by ATPG Based Verification 124, followed by Smart Cutset Based Verification 122. Another method would omit the loop between Smart Cutset Based Verification 122 and ATPG Based Verification 124. Circuit partitioning can also be used after circuit resynthesis, along with BDD Partitioning. For each circuit partition, all of the steps from block 118 to block 138 are performed. The Modified Checking Phase 134 could also be replaced by an Advanced Modified Checking Phase 135. Several of these alternative embodiments of the filter approach are depicted in FIGS. 2B–7. Other than these variants, one skilled in the art may use the basic blocks of the filter approach in different obvious combinations with varying degrees of success.

Figure 8:
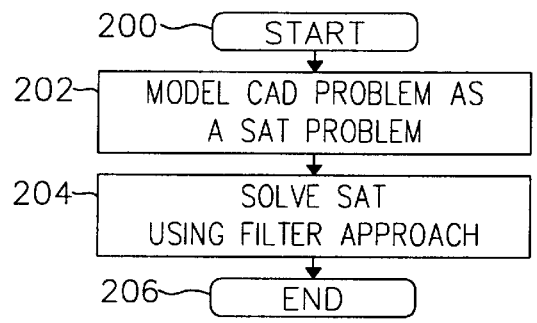
FIG. 8 is a flow diagram of using the filter approach of the present invention as an analysis tool to solve satisfiability (SAT) problems.

It is well known that solving satisfiability (SAT) is a key problem in many areas of CAD. Many problems in CAD can be modeled as a SAT problem. The present invention is applicable to fields such as engineering change, synthesis, layout, and others where a powerful SAT solver is required. The present invention can be used as an analysis tool to solve the SAT problem as shown in FIG. 8. After start step 200, the CAD problem to be solved is modeled as a SAT problem at step 202. Next, the SAT problem is solved using the filter approach of FIG. 2 at step 204. Processing ends at end step 206.

II. Targeted Decomposition

A. Using A Single Decomposition For Each Circuit

During multilevel optimization of digital circuits, several transformations such as elimination, decomposition, extraction, simplification, and substitution are carried out. Some of these transformations could cause local changes to the circuit structure by causing a merging or splitting of various nodes. As a result, many points of correspondence between the original network and its optimized version could disappear. This lack of internal correspondence could make the verification problem very difficult. Therefore, a fast re-synthesis of the networks is performed so that more internal correspondences can be uncovered. For this purpose, a simple Technology Decomposition technique 102 is incorporated. Complex gates in the two networks having more than 4 inputs are decomposed into a two level AND-OR logic network. Also, AND and OR gates with more than 10 inputs are decomposed into AND and OR trees respectively. Groups of existing gates can be retargeted based on an existing library to create new primitive gates in the circuit. This method has been found to be very effective for large and complex circuits.

B. Using Multiple Decompositions For Each Circuit

A method for increasing "similarities" between two circuits $C_1$, $C_2$, and thus rendering them easier to verify, is detailed as follows. The procedure operates by first associating a complex logic gate or a set of logic gates of the given circuits with different technology decompositions. For each technology decomposition, a set of primitive gates is obtained that describe a given complex gate g or a given set of gates. The logic circuitry corresponding to a given technology decomposition is called a local-gate-map. Many local-gate-maps, $g_{M1}, \ldots, g_{Mk}$, are associated with the gate g. This technology decomposition process is repeated over every gate of each of the given pair of circuits, associating multiple local-gate-maps with each gate in each circuit; such a resulting circuit is called a multiple-map circuit. Next, each gate of the multiple-map circuit is evaluated (by simulation). That is, each technology decomposition of each gate of both of the given technology mapped circuits is simulated. The simulation is done using a common set of Boolean assignments (vectors) which is made to their primary input variables, and the corresponding simulation results (signatures) for a given gate in a local-gate-map is stored at that logic gate.

Beginning from the primary inputs, the results (signature) obtained from the given simulation of any complex gate g in the first circuit are now compared with the simulation of another complex gate h in the second circuit. In this comparison, it is determined if the simulation results stored at a gate inside some local-gate-map $g_{Mi}$ of gate g in circuit $C_1$ is such that it is the same as the signature stored at local-gate-map $h_{Mj}$ of some gate h of the circuit $C_2$. Suppose local-gate-maps $g_{Mi}$ and $h_{Mj}$ have the greatest number of pairs of equivalent/complemented signatures. Then the given gates g and h are replaced with the corresponding technology decompositions $g_{Mi}$, and $h_{Mj}$. Thus, a circuit is created in terms of primitive logic gates. An identical process is now repeated over the remaining gates until each given gate is replaced with its corresponding technology decomposition or it is concluded that a suitable replacement is not possible. Hence, two transformed circuits are created from original circuits $C_1$, $C_2$ by replacing each complex gate or a set of gates in the original circuit with a suitable technology decomposition as chosen by the above process.

For efficient performance of the filters, it is preferred to perform such an elaborate technology decomposition process under one or both of the following conditions: (1) the two circuits $C_1$, $C_2$ do not have many equivalent/complemented candidate pairs; and (2) there is a large set of contiguous, internal gates in the two given circuits where there are no equivalent/complemented candidate pairs. Although the multiple decomposition based technology decomposition process is described above at this place in the filter-based verification process, it is intended to be used only after the simulation process has been carried out.

III. Subgraph Isomorphism-based Structural Filter

Changes caused to the structure of a circuit after the application of a synthesis tool are often localized. In such cases, a major portion of the original circuit remains structurally identical to its synthesized version. A method that can utilize the information of identical structures in a direct manner can be more efficient than explicit verification methods like building monolithic OBDDs. For this purpose, a fast method based on the recognition of isomorphism of subgraphs may be employed as Structural Filter 104. The filter processes $N_C$ from the primary inputs to the primary outputs, identifying portions of the network that are isomorphic, which are then merged to produce network $N_{C1}$. In order to identify structurally isomorphic portions of the network, the following method is used. For a gate g, candidate nodes which may be structurally isomorphic to it are identified. This is done as follows. Let $F=\{n_1, \ldots, n_k\}$ be the set of gates that feed into g. Let $C=\{p_1, \ldots, p_j\}$ be the set of gates which have all the gates in F as their immediate fan-ins. Also, all the gates in C are not fed by any other gate. The set C forms the set of candidate gates that will be checked for equivalence with g. If a gate h∈C realizes an identical function as g, then g≡h. The gates g and h are merged and the process is repeated for all the other gates in the network. The time complexity of this step is $O(|N_C|)$.

IV. OBDD Hashing Based Functional Filter

Figure 9:
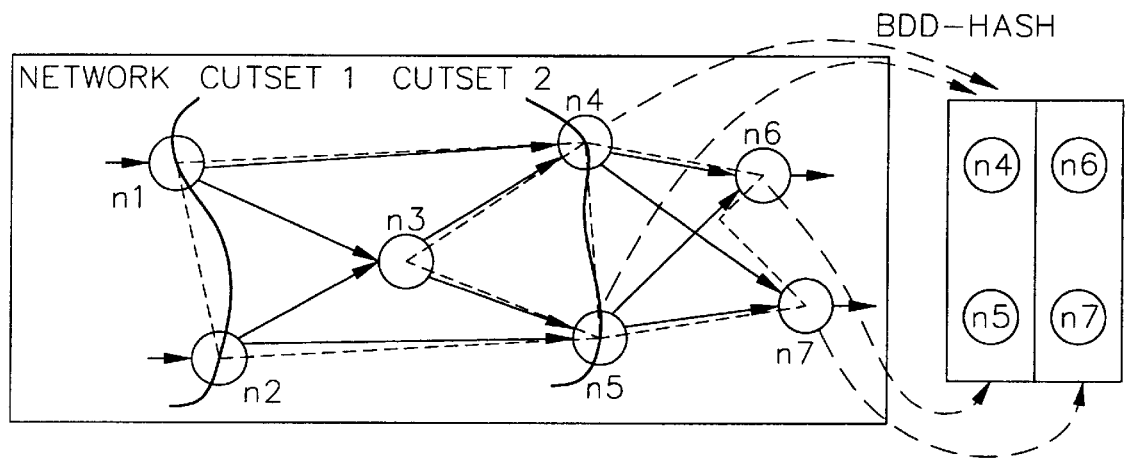
FIG. 9 is diagram illustrating the hashing mechanism for BDDs.

This is a simple Functional Filter 106 based on local OBDDs (OBDDs for nodes in a network are built in terms of a cutset consisting of other internal nodes). This phase identifies internal equivalent nodes in $N_{C1}$. The primary inputs of $N_{C1}$ form the first cutset for building BDDs for the nodes in the network. Independent BDD variables are assigned to the primary inputs and BDDs are built for the internal nodes in $N_{C1}$. In the preferred embodiment, the nodes are processed in a breadth first order. Other orders for processing the nodes can also be chosen. The nodes are hashed into a hash table, BDD-hash, using the pointer to their BDDs as the keys. When the shared BDD data structure reaches a pre-set limit, no further BDDs are built based on the present cutset. All equivalent and complement gates are merged and a new cutset consisting of merged nodes and primary inputs is chosen by depth first traversal from the primary outputs. The process is repeated based on the new cutset. Thus, typically for each gate in the circuit a set of overlapping BDDs can be built based on different circuits. FIG. 9 is diagram illustrating the hashing mechanism for BDDs. The cutset1 consists of the primary inputs to the network. BDDs for the nodes n3, n4 and n5 are built in terms of cutset1. The nodes n4 and n5 hash to the same collision chain in BDD-hash because they have identical BDDs in terms of cutset1.

Figure 10:
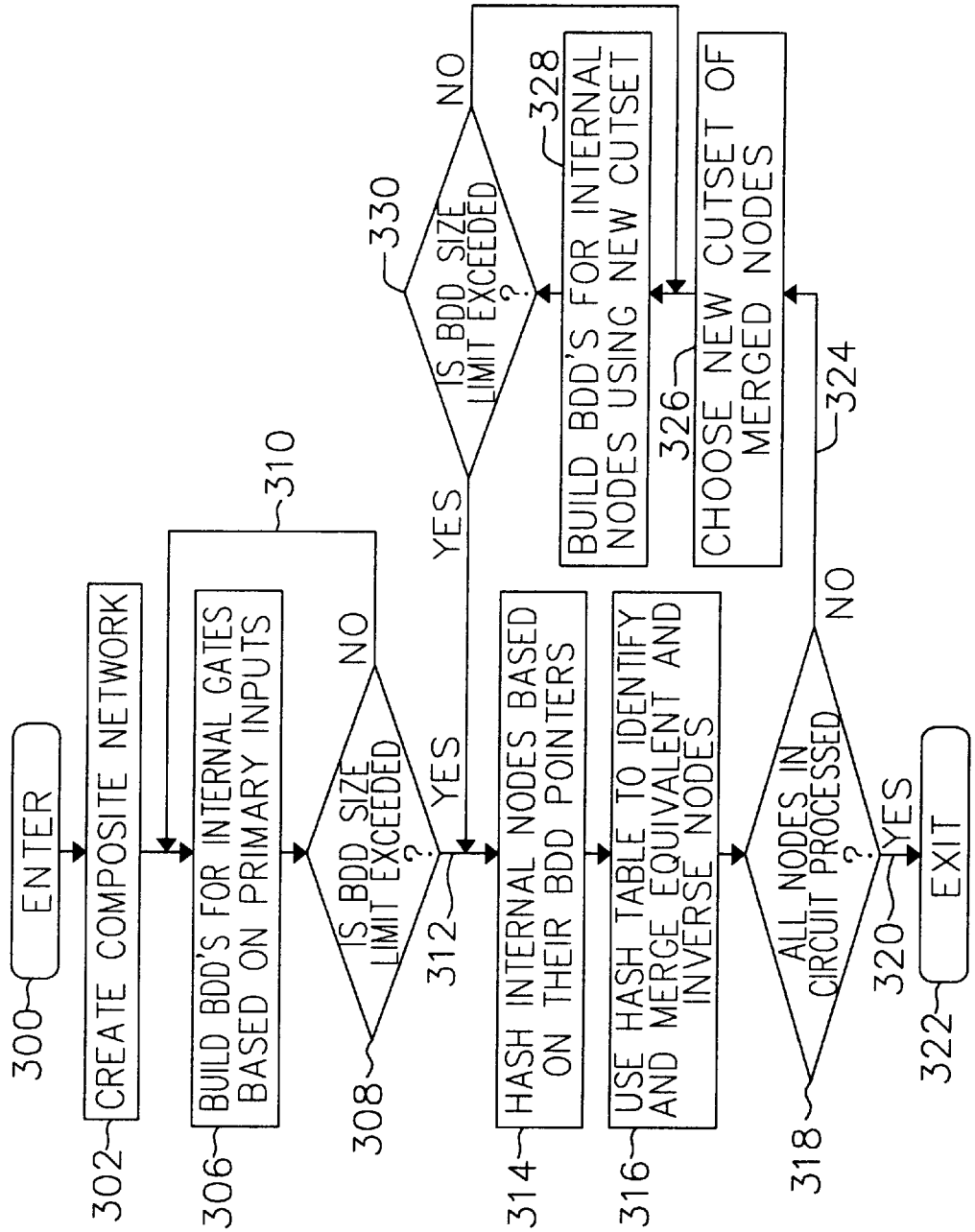
FIG. 10 is a flow diagram of the BDD hash technique.

Two heuristics are used to limit the size of BDDs at any time: (1) based on the size of the shared BDD data structure; and (2) based on the number of structural levels of circuitry for which BDDs are built using any cutset. They are also used to introduce new cutsets based on already discovered equivalent nodes. The equivalent nodes are merged to produce network $N_{C2}$. Typically, a limit of 50,000 nodes being maintained at any given time is imposed on the shared BDD data structure. The maximum number of circuit levels processed using any given cutset is typically 5. The flow diagram of this technique is shown in FIG. 10. If the largest BDD is no more than $S_{limit}$ nodes, then the time complexity of this step is no more than $O(S_{limit} \cdot N_{C1})$f a term linear in the size of circuits for a fixed $S_{limit}$. BDD hash processing starts at Enter step 300. At step 302 a composite network is created. Next, at step 306, BDDs for internal gates based on primary inputs are built. At test step 308, if the BDD size limit has not been exceeded, then No path 310 is taken back to step 306. Otherwise, Yes path 312 is taken to step 314, where the internal nodes are hashed based on their BDD pointers. Next, at step 316 the hash table is used to identify and merge equivalent and inverse nodes. At test step 318, if all nodes in the circuit have been processed, then Yes path 320 is taken and processing ends at Exit 322. Otherwise, No path 324 is taken to step 326, where a new cutset of merged nodes or primary inputs is chosen. At step 328, BDDs for the internal nodes are built using the new cutset. At test step 330, if the BDD size limit is exceeded, then processing continues with step 314. Otherwise, processing continues with step 328.

This filter can be used as a verification tool by itself if it is combined with a random pattern simulation based candidate collection step and a successive compose technique. The flow diagram of such a verification approach is shown in FIG. 11. After start step 350, a composite network is created at step 352. Next, at step 354, random pattern simulation is used to create a hash table containing all pairs of candidate gates. Next, at step 356, BDDs for internal gates based on primary inputs are built and hashed. All equivalent and inverse gates are merged. At test step 358, if all primary outputs (POs) are verified, then Yes path 360 is taken and verification using BDD hash is complete at end step 362. Otherwise, No path 364 is taken to step 366, where false negatives are eliminated using successive compose. Processing then ends at end step 362.

V. Random Pattern Simulation

In this phase, parallel random pattern simulation 108 is carried out on $N_{C2}$ to determine candidate nodes which may be functionally equivalent. Each node is assigned a bit vector (also called a signature) B, of length k, to store the results of the simulation. The typical value of k is 32. This would correspond to a single word of storage on a typical 32-bit computer. The time complexity of this step is $O(k \cdot |N_{C2}|)$. After regression-based simulation, nodes with identical signatures are chosen as candidates for functional equivalence.

Internal gate pairs are checked for functional equivalence or functional complement by associating each gate in both of the circuits with the corresponding primary outputs that each gate reaches or affects. That is, the circuit outputs are determined that are present in the transitive fan-out cone of each gate. Then, random pattern simulation is applied to determine the signature of each gate for a given set of applied random simulation vectors. Each gate pair which has either the same signature or the complement signature and whose output lists intersect are grouped together, such that they have at least one common corresponding primary output in their transitive fan-out cones.

VI. Should The Circuit Be Partitioned?

It was observed in "Functional Partitioning For Verification And Related Problems", by Dr. J. Jain, et al., MIT VLSI Conference 1992, incorporated herein by reference, that verification problems can be considerably simplified by partitioning the $2^n$ Boolean space of an n-variable function, F. This partition can be also regarded as a disjoint partition of the satisfiable set of F. Thus the function F is satisfiable if and only if at least one partition is satisfiable. Such a partitioning is referred to as functional partitioning. Several forms of functional partitioning techniques such as those based on partitioning a circuit structure, and BDD partitioning have been developed. Circuit partitioning creates a set of reduced circuits, and BDD partitioning creates a set of smaller BDDs and is typically applied only for very large BDDs. For example, simulating circuit C on variable $x_i=0$, $x_i=1$ creates two circuit partitions $C_{xi=0}$, and $C_{xi=1}$. Each circuit can be now analyzed independently. In order to verify the original networks $N_1$, $N_2$, we verify whether each partition of $N_{C2}$ can be reduced to a Boolean 0.

Circuit partitioning, in addition to reducing the size of the circuits being verified, has several other advantages: (1) It creates new conditional equivalences. For example, some gates $g_a$, $g_b$ may be only equivalent when variable $x_i=0$. On the other hand, some gates $g_c$, $g_d$ may be only equivalent when $x_i=1$. (2) It creates new conditional learnings. These are implications that only hold in a given partition. Such simplifications greatly ease the verification problem, often speeding up the verification process dramatically.

A decision as to whether to create functional partitions for the given circuit ($N_{C2}$) is taken at this point. At this step in the filter configuration, only circuit partitioning is considered, rather than BDD partitioning, which is invoked only when the present approach cannot verify two given circuits without constructing large BDDs.

The criterion which is used to decide whether to partition the circuit is based on the density of candidates for potential functional equivalence. If it is found that the number of candidates for functional equivalence is very few compared to the total number of gates in $N_{C2}$, or if the frontier of candidates that is nearest to the primary outputs is very far away (structural distance) from the primary outputs, thus leaving a large band of nodes in the two networks that cannot be related easily (without a computationally expensive extraction of indirect implications), then the two circuits are partitioned by assigning Boolean constants to a small number of primary inputs. In general, partitions are created until a sufficient number of potential equivalences between the two circuits are created, or until a preset maximum limit on the number of partitions is exceeded (typically about 8). The primary inputs which influence the largest transitive fan-out cones are chosen as the variables on which to split the circuits.

VII. The Verification Core (VC)

If for a given node pair ($n_1$, $n_2$), the system still has not been able to resolve whether $n_1 \equiv n_2$, then two scenarios are possible:(A) $n_1 \equiv n_2$; to discover the relation, the functional dependence among the internal (input) nodes (variables) in the cone of ($n_1$, $n_2$) must be analyzed. (B) $n_1$ $n_2$; to discover the relation, a satisfying vector for the function $n_1 \oplus n_2$ in terms of primary input variables must be expressed. Either BDD based techniques or ATPG based methods can be used to carry out more sophisticated analysis and prove whether $n_1 \equiv n_2$. An ATPG based method can be regarded as a space-pruning methodology and an OBDD based method as a space compaction (function representation) technique. Thus, an ATPG based method appears to work best when $n_1$ $n_2$ and OBDD based methods are most effective when $n_1 \equiv n_2$, although there are counter cases for both. Due to a rigorous regression based simulation, a majority of the candidate pairs, ($n_1$, $n_2$), are expected to be actually functionally equivalent. Therefore, the initial filters in VC are OBDD based techniques, followed by an ATPG based approach.

A. Structure of the Macro-Filter

The core of the verification program consists of three distinct techniques that are tightly bound by an efficient time-out and space-out mechanism. Two of these three techniques are combined in a loop, constituting a highly efficient internal filter. The top-level filter is referred to as the macro-filter and the internal filter as the micro-filter. Pairs of nodes are picked up from the candidate lists created by Random Pattern Simulation 108 and VC 118 is applied to verify if they are functionally equivalent. If found to be equivalent, the node with the lower structural level is retained in the network and is used to functionally replace the other node. The retained node is marked as an EQ-node.

The three techniques constituting VC are: (1) Naive Cutset Based Verification 120; (2) Smart Cutset Based Verification 122; and (3) ATPG Based Verification 124. Each technique is associated with its own time-out limit (an alarm mechanism has been implemented that keeps track of the elapsed time since a particular technique is invoked and raises an interrupt once a preset time elapses). The first two methods are BDD based and are associated with their own space-out limits (an interrupt is raised and the BDD based mechanism is aborted if the total number of nodes under the BDD manager exceeds a pre-specified limit). The ATPG based method is controlled by setting a limit on the number of backtracks. It is aborted if a preset number of backtracks is exceeded. The Smart-Cutset and ATPG based techniques are arranged in a loop (micro-filter). Each successive entry into this loop causes these two techniques to be invoked with a higher time-out and space-out limit and hence with higher strength. Thus, given a pair of nodes to be verified, each of the two core methods must be given a fair chance to solve the problem before spending more computational resources on the other method. Experiments have shown that this technique is very efficient, especially on large, complex circuits.

B. Local Naive Cutset Based Verification (NCV)

Figure 12A:
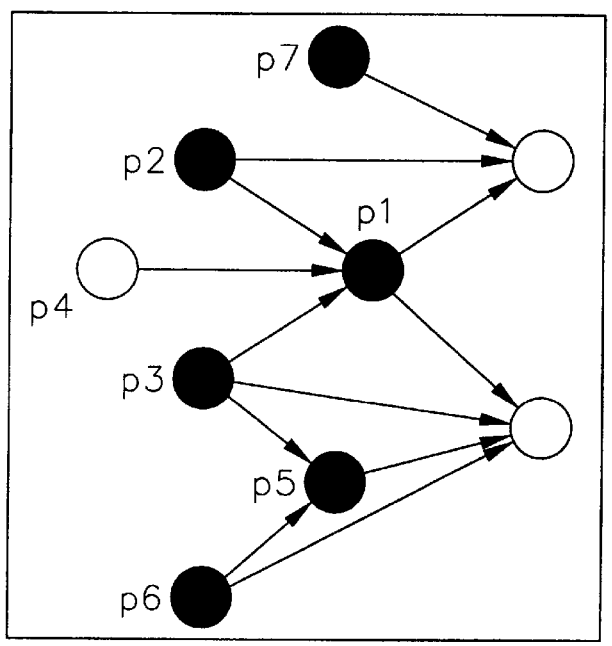
FIG. 12A is a diagram of a cutset stabilization.
Figure 12B:
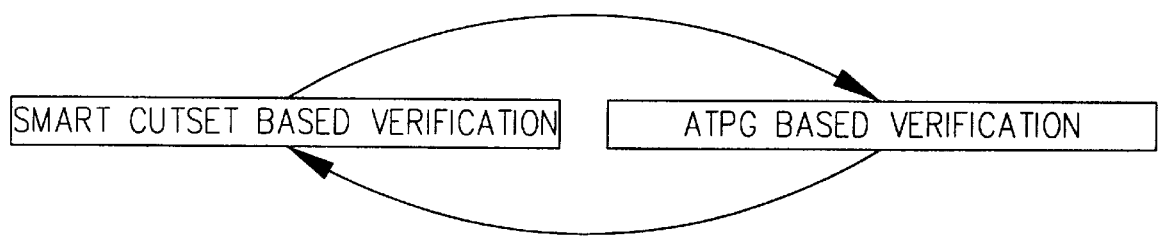
FIG. 12B is a diagram illustrating the micro-filter.

Given two nodes $n_1$ and $n_2$ which have been found to be candidates for functional equivalence by random pattern simulation, first a naive cutset $\lambda$ of internal nodes is chosen. Each node, $n_1 \in \lambda$ is either a primary input or is an EQ-node. Next, this cutset is stabilized to minimize mutual functional dependencies among the nodes in $\lambda$. Each node in $\lambda$ is looked at successively to see if it is completely covered by other members of the cutset. In that case, it is removed from the cutset. For example, in FIG. 12(A) let the initial cutset $\lambda$ consist of nodes {p7, p2, p1, p3, p5, p6}. Node p5 is completely covered by nodes p3 and p6. Therefore, p5 can be removed from the cutset. Also, if a node in the cutset is functionally dependent on one or more members of the cutset and can be replaced with another node such that the dependency is removed, then the replacement is done. Node p1 in FIG. 12(A) is functionally dependent on nodes p2 and p3. Node p1 can be replaced by node p4 which is independent of any other member of $\lambda$. Therefore the stabilized cutset, consists of nodes {p7, p2, p4, p3, p6}. Next, two OBDDs, $B_1$ and $B_2$ are built for $n_1$ and $n_2$ respectively in terms of $\lambda_S$. If $B_1=B_2$, the nodes $n_1$ and $n_2$ are proved to be functionally equivalent. This phase is bound by a time-out and a space-out limit which can be specified by the user. Typical values of the time-out limit and space-out limit would be five seconds (CPU runtime) and 100,000 nodes, respectively.

C. Micro-Filter: Local Smart Cutset Based Verification (SCV)

As noted in Y. Matsunaga, "An Efficient Equivalence Checker For Combinational Circuits", Design Automation Conference (DAC), 1996, the disclosure of which is incorporated herein by reference, if nodes $n_1$ and $n_2$ are equivalent, but this could not be proven by building BDD using naive cutset $\lambda_N$, then the approach failed (i.e., encountered a false negative) since the functional dependence among the cutset variables (don't cares) on the cut $\lambda_N$ could not be properly accounted for by the NCV method. To reduce the possibility of such a false negative, a cutset $\lambda$ is chosen such that the nodes in $\lambda$ have minimal mutual functional dependencies. On the other hand, if $n_1 \neq n_2$ but the relation could not be discovered then, as discussed above, at least part of function $n_1 \oplus n_2$ must be expressed in terms of primary input variables. This is a task that is appropriate for, and gets automatically passed to the ATPG filter when the filter technique of used to minimize functional dependence fails.

Given a set of nodes S, the method to choose a smart cutset proceeds as follows. Let $TFI_S$ be the set of nodes in the transitive fan-ins (TFIs) of all the nodes in S. Two counters, $c_1$ and $c_2$, are associated with each node in $TFI_S$. For each node, $n_i \in TFI_S$, the counter $c_1$ counts the number of nodes in S in whose TFI $n_i$ lies. The value of $c_2$ for all primary inputs is identical to the value of its $c_1$. For all other nodes, $n_j$ in $TFI_S$ with a set of immediate fan-in nodes, $fanin_{nj}$, $c_2$ is computed as follows:

$$c_{2nj} = \forall n_k \in fanin_{nj}, (\max(c_{2nk}, c_{1nj}))$$

Next, a smart cutset is chosen by a simple depth first search procedure that starts from the set S and proceeds towards the primary inputs. The depth first search stops at nodes at which $c_1 \equiv c_2$. After an initial cutset $\lambda$ has been chosen, it is stabilized to obtain $\lambda_S$.

Next, OBDDs are built for the nodes in S in terms of $\lambda_S$. When two nodes $n_1$ and $n_2$ are being verified using smart cutsets, first the exclusive-or (XOR) of the OBDDs of $n_1$ and $n_2$ is built. If this BDD reduces to a 0, the nodes $n_1$ and $n_2$ are proved to be functionally equivalent. Otherwise, a technique called successive compose is used which finds a new stabilized smart cutset in terms of which the present XOR BDD is composed. This process of successive compose is repeated a fixed number of times (typically, 3). If the BDD reduces to a 0, then $n_1 \equiv n_2$. On the other hand, if the BDD becomes satisfiable on primary input variables then $n_1 \neq n_2$. Smart cutset based verification is also controlled by a time-out and a space-out mechanism. Typical values of the time-out limit and the space-out limit are 20 seconds (CPU runtime) and 100,000 nodes respectively. The time-out limit is increased in subsequent passes of SCV. If smart cutset based verification aborts due to a time-out or space-out, or is unable to prove either $n_1 \equiv n_2$ or $n_1 \neq n_2$, ATPG based verification is invoked.

D. Micro-Filter: ATPG Based Verification (AV)

Figure 13A:
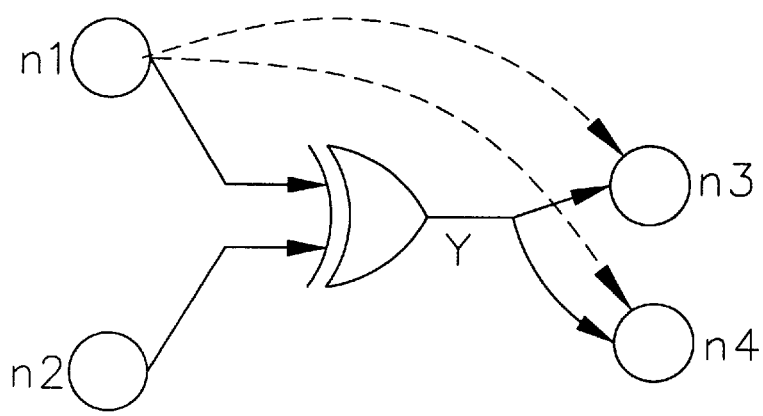
FIG. 13A is a diagram of an example of a miter.

In order to verify $n_1$ and $n_2$ using ATPG, first a miter is created using $n_1$ and $n_2$. A miter is a circuit $n_1 \oplus n_2$ made by taking the exclusive-or (XOR) of corresponding outputs of two circuits. FIG. 13(A) shows an example of a miter. The dotted lines show the original circuit connections. A new XOR gate is introduced and the outputs of the XOR gate feeds the nodes that were originally fed by node $n_1$. Next, an ATPG tool is used to test the fault stuck-at-zero (s-a-0) at Y as shown in FIG. 13(A). If the fault is proved to be redundant then $n_1$ is either functionally equivalent to $n_2$ or they are equivalent to each other under an observability don't care (ODC) condition. The time spent in this phase is controlled by limiting the number of backtracks allowed in the ATPG process and by activating a time-out mechanism. For the first pass of AV, the backtrack limit is typically set to 50. This limit is increased in subsequent passes. The time-out-limit is typically set to 50 seconds and is also increased in subsequent passes.

If after the first pass through SCV and AV, $n_1$ and $n_2$ have neither been proven to be functionally equivalent nor have they been proven to be functionally inequivalent, SCV and AV are repeated (within the micro-filter) with higher time-out, space-out and backtrack limits. Thus, VC accepts network $N_{C2}$ and produces network $N_{C3}$. The time complexity of this transformation depends on the space and time limits set on the OBDD and ATPG routines, and is thus fully controllable.

VIII. Checking Phase

In checking phase 126, the corresponding pairs of primary outputs are analyzed to try to verify their equivalence. In the network $N_{C3}$, all functionally equivalent nodes have already been merged, and equivalence of numerous primary outputs have possibly already been identified. Thus, the preceding phase is often sufficient to verify two circuits. However, there are some circuits which cannot be verified by VC itself. Since numerous (easier) equivalent nodes between the two original circuits have already been obtained, the problem of a full BDD construction is now simplified considerably. In this phase, to construct the output BDD the present invention successively composes OBDDs of output $F_1 \oplus F_2$ in terms of cutsets of internal equivalent points until the primary inputs are reached, or until the function is reduced to a zero. However, dictated by the present invention's filter philosophy, and mindful of the OBDD blowup for intractable functions, BDD construction is terminated after a large preset space-out/time-out limit is exceeded.

IX. ODC Equivalence and ODC Learning Based Resynthesis

In this step, each of the remaining unverified primary output pairs are separately targeted. For each such output pair, a new network $N_{hard}$ is created for its transitive fan-in cone. The purpose of this phase is to discover more complex relations among the nodes of $N_{hard}$ and use these relations to re-synthesize $N_{hard}$ so that the verification problem is simplified. The cutset of EQ nodes nearest to the selected output pair is located. The nodes ahead of this frontier constitute the set Ahead Of Frontier (AOF). All the nodes in AOF are such that none of them has been found to be functionally equivalent to any other node in $N_C$. The purpose of this phase is to extract nodes that are equivalent or have learning relations with other nodes under the ODC of the network.

A. Identification Of ODC Equivalence and ODC Learning Candidates

First, the circuit is randomly simulated to obtain the signature of each node. A pair of nodes are now candidates for ODC equivalence if their signatures as obtained by the simulation differ in no more than $k_1$ bits; here, $k_1$=1. This number is chosen because the functional difference between two nodes over a very small portion of the input space can often be masked by observability don't cares and may not show up at the primary outputs. For candidates for ODC learning, the following four operations are carried out between the signatures of each pair of nodes $n_i$, $n_j \in$ AOF: (1) $\overline{sig_{ni} \vee sig_{nj}}$; (2) $sig_{ni} \vee sig_{nj}$; (3) $sig_{ni} \vee \overline{sig_{nj}}$; (4) $\overline{sig_{ni}} \vee \overline{sig_{nj}}$.

Here, $sig_{ni}$ refers to the signature of node $n_i$. The result of the first operation listed above is a tautology if $n_i \rightarrow n_j$.

Similarly, the other three operations are for the three other cases of learning. In order to identify candidates for ODC learning, the resultant signature of each of the above operations is compared with the all-one signature, that is, each bit of this signature is a Boolean 1. If the resultant signature differs from the all-one signature in no more than $k_2$ bits (again, we chose $k_2=1$) then the two nodes are considered to be candidates for ODC learning. Once the candidates for ODC equivalence and ODC learning have been found, routines for extracting these relations are invoked.

B. Extracting ODC Equivalence and ODC Learnings

Figure 13B:
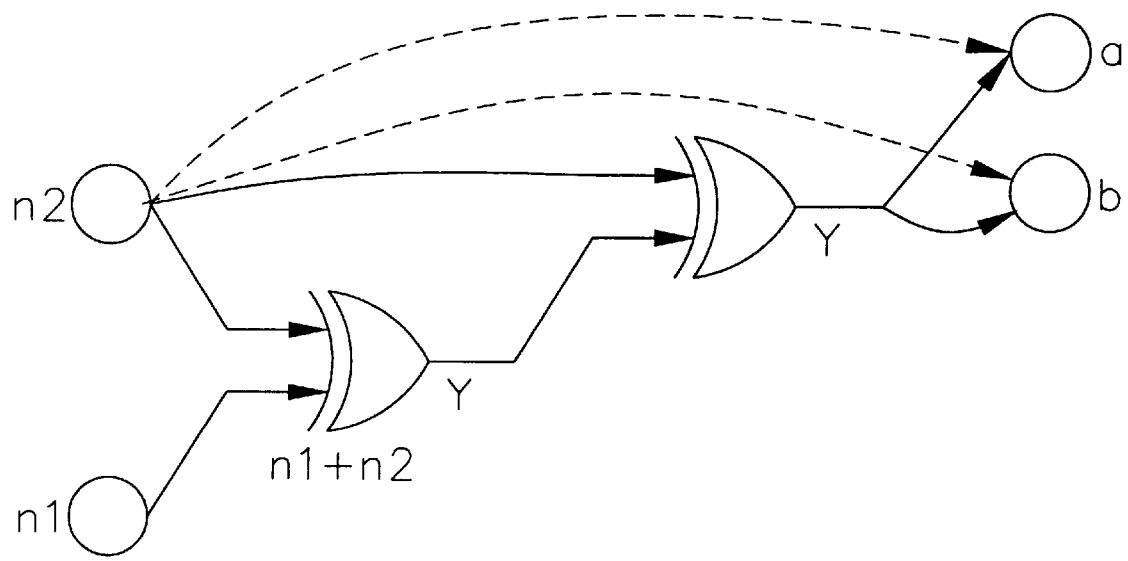
FIG. 13B is a diagram illustrating the extraction of ODC learning.

Extraction of ODC equivalences is identical to ATPG based verification. Extraction of ODC learnings is explained in detail in this section. Let us suppose nodes $n_1$ and $n_2$, have been found to be candidates for the learning $n_1 \rightarrow n_2$ under ODC. Then, a miter is created as shown in FIG. 13(B). Next, an ATPG tool is invoked to test the fault s-a-0 at Y. If the fault is redundant, then $n_1 \xrightarrow{ODC} n_2$ and $n_1 \vee n_2$ can be used to functionally replace $n_2$ in the circuit. The other three types of ODC learning can be extracted in a similar manner. Such re-synthesis also helps merge the two circuits and can potentially simplify the verification problem. In addition, such a re-synthesis often creates more functional equivalences among the nodes in AOF. These can be exploited to further simplify the verification. After the re-synthesis is completed, VC and the checking phase are re-invoked on $N_{hard}$, which has a single pair of primary outputs. If during this checking phase, the BDD sizes explode, BDD partitioning is invoked as described below.

X. Binary Decision Diagram (BDD) Partitioning

BDD partitioning constructs the BDD of a difficult function F (which has a very large monolithic BDD) by partitioning the $2^n$ Boolean space of F into disjoint subspaces and representing each subspace separately. Each partition of the BDD is assigned a new BDD manager, and can thus be individually reordered. Further partitions can be dynamically created during successive compose, depending on the limit on the BDD size. Partitioning can greatly alleviate the problem of BDD explosion. When each partition is represented by a separate BDD, each such BDD possibly made independently, then such a resulting representation of the given function is called a "partitioned" OBDD representation.

A. What Are Partitioned ROBDDs: Definition

Assume there is a Boolean function $f:B^n \rightarrow B$ defined over n inputs $X_n=\{x_1, \ldots, x_n\}$. The partitioned-ROBDD representation $X_f$ of f is defined as follows:

Given a Boolean function $f:B^n \rightarrow B$ defined over $X_n$, a partitioned-ROBDD representation $X_f$ of f is a set of k function pairs, $\chi_f = \{(\omega_1, \overline{f}_1), \ldots, (\omega_k, \overline{f}_k)\}$ where, $\omega_i: B^n \rightarrow B$ and $\overline{f}_i:B^n \rightarrow B$, for $1 \leq i \leq k$, are also defined over $X_n$ and satisfy the following conditions:

1. $w_i$ and $\overline{f}_i$ are represented as ROBDDs with the variable ordering $\pi_i$, for $1 \leq i \leq k$.
2. $w_1+w_2+\ldots+w_k=1$
3. $\overline{f}_i=w_i \wedge f$, for $1 \leq i \leq k$ Here, + and $\wedge$ represent Boolean OR and AND respectively. The set $\{w_1, \ldots, W_k\}$ is denoted by W.

Each $w_i$ is called a window function. Intuitively, a window function $w_i$ represents a part of the Boolean space over which f is defined. Every pair $(w_j, \overline{f}_i)$ represents a partition of the function f. Here we are not using the term "partition" in the conventional sense where partitions have to be disjoint. If in addition to Conditions 1–3, we also have that $w_i \wedge w_j=0$ for $i \neq j$ then the partitions are said to be orthogonal; clearly, each $(w_j, \overline{f}_i)$ is now a partition in the conventional sense.

B. How to Construct Partitioned ROBDDs

The performance of partitioned reduced ordered binary decision diagrams (ROBDDs) depends critically on the ability to generate good partitions of the Boolean space over which the function can be compactly represented. The issue of finding good partitions of the Boolean space is central to the partitioned-ROBDD representation. Described herein are simple heuristics which are very effective in generating compact, orthogonally partitioned-ROBDDs. Although a Boolean netlist is used in the present approach, the techniques are general and can be applied to any arbitrary sequence of Boolean operations.

In the present BDD partitioning approach, the number of windows is decided either a priori or dynamically. After a window $w_i$ is decided, a partitioned-ROBDD corresponding to it is obtained by composing F in the Boolean space corresponding to the window $w_i$.

In partitioning the BDD for some function F, we work on a decomposed BDD representation (that is, a BDD which is not in terms of input variables but in terms of some pseudo-input variables that are created in the process of building BDDs for the given target function F). If we want to create the partitioned BDD for F then its decomposed BDD is analyzed to yield the partitions. The partition decision is typically taken because we cannot compose the decomposed BDD for F in terms of its decomposition points, $\psi_1, \ldots, \psi_k$. Note, we can create the partitioned BDD for F, from its decomposed BDD, in three ways.

(1) Partition using input variables. The number of input variables can be changed dynamically or can be set to a predetermined constant.

(2) Partition using "internal" variables; that is, variables which are not input variables. Such variables can be pseudo-variables introduced at internal gates.

(3) Partition using a combination of 1 and 2.

At any given point of time in the present filtering based verification process we have a decomposed representation, $f_d(\Psi, X)$, of F where $\Psi=\{\psi_1, \ldots, \psi_k\}$ is called a decomposition set, and it corresponds to the internal cutset selected, typically, by the naive cut or the smart cut process, and each $\psi_i \in \Psi$ is a decomposition point. Let $\Psi_{bdd}=\{\psi_{1_{bdd}}, \ldots, \psi_{k_{bdd}}\}$ represent the array containing the ROBDDs of the decomposition points, i.e., each $\psi_i \in \Psi$ has a corresponding ROBDD, $\psi_{i_{bdd}} \in \Psi_{bdd}$, in terms of primary input variables as well as (possibly) other $\psi_j \in \Psi$, where $\psi_j \neq \psi_i$. Similarly we represent the array of $\psi_{i_{bdd} w_i}$ by $\Psi_{i_{bdd} w_i}$. The composition [?] of $\psi_i$ in $f_d(\Psi, X)$ is denoted by $f_d(\Psi, X) \cdot (\psi_i \leftarrow \psi_{i_{bdd}})$ where, $$f_d(\Psi, X) \cdot (\psi_i \leftarrow \psi_{i_{bdd}}) = \overline{\psi_{i_{bdd}}} \cdot f_{d\overline{\psi_i}} + \psi_{i_{bdd}} \cdot f_{d\psi_i} \quad (1)$$

The vector composition of the $\Psi$ in $f_d(\Psi, X)$ is denoted by $f_d(\psi, X) \cdot (\psi \leftarrow \psi_{bdd})$ and represents successive composition of $\psi_i$'s into $f_d$.

C. Partitioning A Decomposed Representation

Given a window function $w_i$, a decomposed representation $f_d(\Psi, X)$, and the ROBDD array $\Psi_{bdd}$ of f, we want to find $f_i$ such that the ROBDD representing $\overline{f}_i=w_i \wedge f_i$ is smaller than f. It can be shown that all $w_i$ which are nothing but cubes will satisfy this requirement.

Now, given $f_d$, $\Psi_{bdd}$ and $w_i$s we create the cofactors $\psi_{w_i}$ and $f_{d_{w_i}}$. Then by composing $\psi_{bdd_{w_i}}$ in $f_{d_{w_i}}$, we get partition function $f_i=f_{w_i}$. So given a set of window functions $w_i$, the partitioned-ROBDD $x_f$ of f is given by $\chi_f=\{(w_i, w_i \wedge f_{w_i}) | 1 \leq i \leq k\}$. It is easy to check that the above definition satisfies all the conditions of Definition 3.1.

If $w_i$ is a cube, $f_i$ is guaranteed to have a smaller size than the ROBDD for f. Also, the ROBDD representing $w_i$ has k internal nodes where k is the number of literals in $w_i$. Since $w_i$ and $f_{w_i}$ have disjoint support, $|\overline{f}_i|=|w_i \wedge f_i|=(k+|f_i|)\approx|f_i|$. Also, as each intermediate result of building $f_i$ will be smaller than that of building $f$, the intermediate peak memory requirement is also reduced.

Note that the above observation doesn't hold in the presence of dynamic variable reordering when $f$ and $f_i$ can have different variable orderings. However, in practice since dynamic variable reordering is working on smaller graphs in the case of partitioning it is perhaps even more effective.

Even when the window function is a more complex function of PIs than a cube, we use $f_i = f_{w_i}$. Here $f_{w_i}$ is the generalized cofactor of $f$ on $w_i$. The generalized cofactor of $f$ on $w_i$ is generally much smaller than $f$. But in this case the size of the $i^{th}$ partitioned-ROBDD $|\overline{f}_i|$ can be $O(|w_i||f_i|)$ in the worst case. To avoid this, while using general window functions we use $w_i$s which are small.

D. Selection of Window Functions

After deciding how to construct the partition function from a give window function we examine methods to obtain good window functions. These methods can be divided into two categories: a priori selection and "explosion" based selection.

1. A Priori Partitioning

In this method we select a predetermined number of primary inputs (PIs) to partition. If we decide to partition on 'k' PIs then we create $2^k$ partitions corresponding to all the binary assignments of these variables. For example, if we decide to partition on say $x_1$ and $x_2$ then we create four partitions $x_1 x_2$, $x_1 \overline{x_2}$, $\overline{x_1} x_2$ and $\overline{x_1} \overline{x_2}$. From the observation made in the previous section, we know that given window functions of this kind we can create partitioned-ROBDDs which are guaranteed to be smaller than the monolithic ROBDD. Since only one partition needs to be in the memory at a given time we will always win in space. In the results section we will see that the reduction in memory is large and is accompanied by an overall reduction in the time taken to process all partitions as well.

We want to select those variables which maximize the partitioning achieved while minimizing the redundancy that may arise in creating different partitions independently; a fundamental principle of any divide and conquer approach. For this we define the cost of partitioning a function $f$ on variable $x$ as $$cost_x(f) = \alpha[p_x(f)] + \beta[r_x(f)] \quad (2)$$

where $p_x(f)$ represents the partitioning factor and is given by, $$p_x(f) = \max\left(\frac{|f_x|}{|f|}, \frac{|f_{\overline{x}}|}{|f|}\right) \quad (3)$$

and $r_x(f)$ represents the redundancy factor and is given by, $$r_x(f) = \frac{|f_x| + |f_{\overline{x}}|}{|f|} \quad (4)$$

Notice that a lower partitioning factor is good as it implies that the worst of the two partitions is small and similarly a lower redundancy factor is good since it implies that the total work involved in creating the two partitions is less. The variable $x$ which has the lower overall cost is chosen for partitioning.

For a given vector of functions $F$ and a variable $x$, the cost of partitioning is defined as:

$$cost_x(F) = \sum_{i=1}^{k} cost_x(f_i) \quad (5)$$

We order all the PIs in increasing order of their cost of partitioning $f_d$ and $\Psi$ and select the best 'k' (where 'k' is a predetermined number specified by the user). Note that using a similar cost function we can select not only PI variables but also pseudo-variables, such as a $\psi_{i_{bdd}}$ expressed in terms of PIs, to create partitioned-ROBDDs. In this case the cofactor operations become generalized cofactor operations for window functions which are non-cubes. This type of selection, where all the PIs are ranked according to their cost of partitioning $f_d$ and $\Psi$, is called a static partition selection. On the other hand, we can have a dynamic partitioning strategy in which the best PI (say x) is selected based on $f_d$ and $\Psi$ and then the subsequent PIs are recursively selected based on $f_{d_x}$ and $\Psi_x$ in one partition and in $f_{d_{\overline{x}}}$ and $\psi_{\overline{x}}$ in the other partition. The dynamic partitioning method will require an exponential number of cofactors and can be expensive. This cost can be somewhat reduced by exploiting the fact that the only values that we are interested in are the sizes of the cofactors of $f_d$ and $\psi_{i_{bdd}}$s. An upper bound on the value of $|f_{d_x}|$ can be calculated by traversing the ROBDD of $f_d$ and taking the x=1 branch whenever the node with variable id corresponding to x is encountered. This method doesn't give the exact count as the BDD obtained by traversing the ROBDD in this manner is not reduced. The advantage is that no new nodes need to be created and the traversal is fast.

We can also choose to create partitions such that the number of partitions are chosen dynamically. In this case, each time the BDDs blow-up (see the description of strategy 2 for details on how to quantify BDD blow-up) we partition it dynamically using splitting variables, chosen in the increment of 1, till the BDD blow-up is deemed to be circumvented.

2. Explosion Based Partitioning

In this method we successively compose the $\psi_{i_{bdd}}$s in $f_d$. If the graph size increases drastically for some composition (say $\Psi_j$), we select a window function, $w$, based on the current $f_d$ and $\psi_{j_{bdd}}$. (The window functions are either a PI and its complement or some $\psi_{k_{bdd}}$ and its complement which is expressed in terms of PIs only and has a very small size.) Once the window function w, is obtained, we create two partitions ($w \wedge f_{d_w}, \psi_w$) and ($\overline{w} \wedge f_{d_{\overline{w}}}, \psi_{\overline{w}}$) and recursively call the routine on each of the partitions.

Typically, if the resulting BDD after composition is more than 10 times larger then the sum of all the previous decompose-BDDs that have already been composed plus the size of original decomposed BDD then we chose to carry out the explosion based partitioning.

3. A Priori Variable Selection As Well As Explosion Based Partitioning

In this strategy we decide a fixed number of splitting variables and carry out either explosion based partitioning followed by a fixed number of primary input variables based partitioning or a vice-versa process. Note the explosion based partitioning can use both the primary inputs as well as pseudo-variables/decomposition points.

E. Order of Composition

After we have selected a window function and created the decomposed representation for the $i^{th}$ partition given by $f_{d_w i}$ and $\psi_{w_i}$, the final step is to compose $\psi_{w_i}$ in $f_{d_w i}$, i.e., $f_{d_w i}(\psi, \chi)(\psi \leftarrow \psi_{bdd_w i})$. Although, the final ROBDD size is constant for a given variable ordering, we observe that the intermediate memory requirement and the time for composition is a strong function of the order in which the decomposition points are composed.

For every candidate variable that can be composed into $f_d$, we assign a cost which estimates the size of the resulting composed ROBDD. The variable with the lowest cost estimate is composed. Once again a simple cost function based on the support set size was found to perform well in practice. Accordingly, we choose that decomposition variable which leads to the smallest increase in the size of the support set of the ROBDD after composition. At each step, we restrict the candidate $\psi$s for composition to those decomposition points which are not present in any of the other $\psi_{bdd}$S. This guarantees that a decomposition variable needs to be composed only once in $f_d$.

While various embodiments of the invention have been particularly shown, it will be understood by those skilled in the art that various changes in form and detail may be made without departing from the scope and spirit of the present invention.

What is claimed is:

1. A computer-implemented method of verifying a combinational circuit being represented by a circuit data structure comprising the steps of:
   executing a plurality of complete verification techniques and a plurality of supporting techniques arranged in a sequence for the combinational circuit, each of the plurality of complete verification techniques being capable of determining a verification result and each of the plurality of supporting techniques being capable of altering the circuit data structure;
   providing the verification result to one of subsequent complete verification techniques;
   providing the altered circuit data structure to one of subsequent supporting techniques; and
   repeating the executing and providing steps until a resultant altered circuit data structure is determined.

2. A system for verifying a combinational circuit represented by a circuit data structure comprising:
   means for executing a plurality of complete verification techniques and a plurality of supporting techniques arranged in a sequence for the combinational circuit, each of the plurality of complete verification techniques being capable of determining a verification result and each of the plurality of supporting techniques being capable of altering the circuit data structure, for passing the verification result to one of subsequent complete verification techniques in the sequence, for passing the altered circuit data structure to one of subsequent supporting techniques in the sequence, and for providing a resultant altered circuit data structure.

3. A computer-implemented method of verifying a combinational circuit being represented by a circuit data structure comprising the steps of:
   executing a plurality of complete verification techniques and a plurality of supporting techniques arranged in a sequence for the combinational circuit, each of the plurality of complete verification techniques being capable of determining a verification result and each of the plurality of supporting techniques being capable of altering the circuit data structure;
   providing the verification result to one of subsequent complete verification techniques;
   providing the altered circuit data structure to one of subsequent supporting techniques; and
   repeating the executing and providing steps until a final verification result is determined.

4. The computer-implemented method of claim 3, wherein the executing and providing steps are repeated until a predetermined set of constraints on computer memory usage are exceeded.

5. The computer-implemented method of claim 3, wherein one of the plurality of complete verification techniques is a naive cutset based verification technique.

6. The computer-implemented method of claim 3, wherein one of the plurality of complete verification techniques is a smart cutset based verification technique.

7. The computer-implemented method of claim 3, wherein one of the plurality of complete verification techniques is an automatic test pattern generation based verification technique.

8. The computer-implemented method of claim 3, wherein the plurality of complete verification techniques include a first one of the complete verification techniques is a smart cutset based verification technique and a second one of the complete verification techniques is an automatic test pattern generation based verification technique, and further comprising the steps of performing the smart cutset based verification technique followed by the automatic test pattern generation technique and repeating performance of the smart cutset based verification technique and the automatic test pattern generation technique until a final verification result is determined.

9. The computer-implemented method of claim 3, wherein the plurality of complete verification techniques and the plurality of supporting techniques include a first technique in the sequence which is weaker than a second, succeeding technique in the sequence, weakness being empirically determined on a sample set of benchmark circuits similar to the combinational circuit wherein computational time and memory space requirements for verification of the sample set of benchmark circuits according to the first technique are less than for the second technique.

10. The computer-implemented method of claim 3, wherein the combinational circuit is partitioned into a plurality of partitions, each partition being another combinational circuit, and the executing and providing steps operate on individual partitions of the combinational circuit.

11. The computer-implemented method of claim 3, wherein one of the plurality of supporting techniques is a subgraph isomorphism-based structural filter technique.

12. The computer-implemented method of claim 3, wherein one of the plurality of supporting techniques is a hashing-based functional filter technique.

13. The computer-implemented method of claim 3, wherein one of the plurality of supporting techniques is a random pattern generation technique.

14. The computer-implemented method of claim 3, wherein one of the plurality of supporting techniques is a binary decision diagram (BDD) partitioning technique.

15. The computer-implemented method of claim 3, wherein one of the plurality of supporting techniques is an observability don't care (ODC) and learning-based resynthesis technique.

16. The computer-implemented method of claim 3, wherein the executing and providing steps are repeated until a predetermined set of constraints on computer execution time usage are exceeded.

17. The computer-implemented method of claim 3, wherein the executing and providing steps are repeated until the final verification result is determined.

18. The computer-implemented method of claim 3, wherein the executing and providing steps are repeated until the resultant altered circuit data structure is determined.

19. The computer-implemented method of claim 3, wherein the plurality of complete verification techniques include a first one of the complete verification techniques is a smart cutset based verification technique and a second one of the complete verification techniques is an automatic test pattern generation based verification technique, and further comprising the steps of performing the smart cutset based verification technique followed by the automatic test pattern generation technique and repeating performance of the smart cutset based verification technique and the automatic test pattern generation technique until the plurality of complete verification techniques exceed a predetermined maximum set of resources defined in terms of space, time, or number of backtracks used in the automatic test pattern generation technique.

20. A method for increasing similarities between a pair of circuits and rendering the circuits easier to be verified by creating a new circuit, the circuits being comprised of a plurality of logic gates, the method comprising the steps of:
   associating each logic gate with a set of corresponding technology decompositions for every gate of each of the pair of circuits;
   simulating each logic gate of the circuits for each of the associated technology decompositions with a common set of Boolean assignments made to primary input variables of the circuits to produce signatures for each gate in each of the associated technology decompositions;
   associating one of the technology decompositions with each logic gate of each circuit, with each technology decomposition chosen such that after application of the technology decompositions, primitive logic gates in the two circuits have associated signatures such that when the signatures of the gates of the two decomposed circuits are compared, a highest number of pairs of gates with equivalent or complemented signatures are obtained; and
   creating the new circuit in terms of primitive logic gates by replacing each logic gate in the pair of circuits with the technology decompositions associated in the second associating step.

21. A system for analyzing a combinational circuit represented by a circuit data structure comprising:
   means for executing a plurality of complete analysis techniques and a plurality of supporting techniques arranged in a sequence for the combinational circuit, each of the plurality of complete verification techniques being capable of determining an analysis result and each of the plurality of supporting techniques being capable of altering the circuit data structure, for passing the analysis result to one of subsequent complete analysis techniques in the sequence, for passing the altered circuit data structure to one of the supporting techniques in the sequence, and for providing a resultant altered circuit data structure.

22. A computer-implemented method of analyzing a combinational circuit being represented by a circuit data structure comprising the steps of:
   executing a plurality of complete analysis techniques and a plurality of supporting techniques arranged in a sequence for the combinational circuit, each of the plurality of complete verification techniques being capable of determining an analysis result and each of the plurality of supporting techniques being capable of altering the circuit data structure;
   providing the analysis result to one of the subsequent complete analysis techniques;
   providing the altered circuit data structure to one of the subsequent supporting techniques; and
   repeating the executing and providing steps until a final analysis result is determined.

23. The computer-implemented method of claim 22, wherein the executing and providing steps are repeated until a predetermined set of constraints on computer memory usage are exceeded.

24. The computer-implemented method of claim 22, wherein of the plurality of complete verification techniques and each of the plurality of supporting techniques include a first technique in the sequence which is weaker than a second, succeeding technique in the sequence, weakness being empirically determined on a sample set of benchmark circuits similar to the combinational circuit wherein computational time and memory space requirements for analysis of the sample set of benchmark circuits according to the first technique are less than for the second technique.

25. The computer-implemented method of claim 22, wherein the executing and providing steps are repeated until a predetermined set of constraints on computer memory usage are exceeded.

26. The computer-implemented method of claim 22, wherein the executing and providing steps are repeated until the final analysis result is determined.

27. The computer-implemented method of claim 22, wherein the executing and providing steps are repeated until the resultant altered circuit data structure is determined.

28. A computer-implemented method of analyzing a combinational circuit being represented by a circuit data structure comprising the steps of:
   executing a plurality of complete analysis techniques and a plurality of supporting techniques arranged in a sequence for the combinational circuit, each of the plurality of complete verification techniques being capable of determining an analysis result and each of the plurality of supporting techniques being capable of altering the circuit data structure;
   providing the analysis result to one of the subsequent complete analysis techniques;
   providing the altered circuit data structure to one of the subsequent supporting techniques; and
   repeating the executing and providing steps until a resultant altered circuit data structure is determined.

29. A computer-implemented method of verifying a pair of combinational circuits represented by circuit data structures comprising the steps of:
   (a) simulating, using random pattern simulation, the circuit data structures to produce candidate lists;
   (b) pruning the candidate lists;
   (c) partitioning the pair of combinational circuits into a plurality of partitions;
   (d) applying a macro-filter to at least one of the plurality of partitions, the macro-filter comprising at least a naive cutset based verification technique, a smart cutset based verification technique, and an automatic test pattern generation verification technique;
   (e) re-synthesizing the at least one of the plurality of partitions using an observability don't care (ODC) and learning-based resynthesis technique;
   (f) applying the random pattern simulation to select candidates from the candidate lists pruned for equivalence checking and applying the macro-filter to the at least one of the plurality of partitions resynthesized;
   (g) checking the at least one of the plurality of partitions resynthesized using binary decision diagram (BDD) partitioning;

(h) repeating steps (d)–(g) until resultant circuit data structures are determined for the at least one of the plurality of partitions; and (i) repeating steps (d)–(h) for all the plurality of partitions of the pair of combinational circuits.

30. A computer-implemented method of analyzing a pair of combinational circuits represented by circuit data structures comprising the steps of:

(a) simulating, using random pattern simulation, the circuit data structures to produce candidate lists;

(b) pruning the candidate lists;

(c) partitioning the pair of combinational circuits into a plurality of partitions;

(d) applying a macro-filter to at least one of the plurality of partitions, the macro-filter comprising a circuit analysis technique;

(e) re-synthesizing the at least one of the plurality of partitions using an observability don't care (ODC) and learning-based resynthesis technique;

(f) applying random pattern simulation to select candidates from the candidate lists pruned for equivalence checking and applying the macro-filter to the at least one of the plurality of partitions resynthesized;

(g) checking the at least one of the plurality of partitions resynthesized using binary decision diagram (BDD) partitioning;

(h) repeating steps (d)–(g) until resultant circuit data structures are determined for the at least one of the plurality of partitions; and (i) repeating steps (d)–(h) for all the plurality of partitions of the pairs of combinational circuits.

31. A computer-implemented method of analyzing a pair of combinational circuits represented by circuit data structures comprising the steps of:

(a) simulating, using random pattern simulation, the circuit data structures to produce candidate lists;

(b) pruning the candidate lists;

(c) partitioning the pair of combinational circuits into a plurality of partitions;

(d) applying a macro-filter to at least one of the plurality of partitions, the macro-filter comprising a circuit analysis technique;

(e) re-synthesizing the at least one of the plurality of partitions using an observability don't care (ODC) and learning-based resynthesis technique;

(f) applying random pattern simulation to select candidates from the candidate lists pruned for equivalence checking and applying the macro-filter to the at least one of the plurality of partitions resynthesized;

(g) checking the at least one of the plurality of partitions resynthesized using binary decision diagram (BDD) partitioning;

(h) repeating steps (d)–(g) until a final analysis result is determined for the at least one of the plurality of partitions; and (i) repeating steps (d)–(h) for all the plurality of partitions of the pairs of combinational circuits.

32. The computer-implemented method of claim 31, further comprising the step of applying a functional filter to the circuit data structures prior to performing the simulating step.

33. The computer-implemented method of claim 32, further comprising the step of applying a structural filter to the circuit data structures prior to applying the functional filter.

34. The computer-implemented method of claim 33, further comprising the step of performing targeted decomposition of the circuit data structures prior to applying the structural filter.

35. The computer-implemented method of claim 31, wherein the pruning step comprises the steps of:

associating, for each gate in the pair of combinational circuits, corresponding primary outputs that each gate affects;

applying random pattern simulation to determine a signature of each gate for a set of applied random simulation vectors; and assigning each pair of gates which has either the same or the complement signature and whose output lists intersect, to a group for subsequent checking of functional equivalence or functional complement.

36. A computer-implemented method of verifying a pair of combinational circuits represented by circuit data structures comprising the steps of:

(a) simulating, using random pattern simulation, the circuit data structures to produce candidate lists;

(b) pruning the candidate lists;

(c) partitioning the pair of combinational circuits into a plurality of partitions;

(d) applying a macro-filter to at least one of the plurality of partitions, the macro-filter comprising at least a naive cutset based verification technique, a smart cutset based verification technique, and an automatic test pattern generation verification technique;

(e) re-synthesizing the at least one of the plurality of partitions using an observability don't care (ODC) and learning-based resynthesis technique;

(f) applying the random pattern simulation to select candidates from the candidate lists pruned for equivalence checking and applying the macro-filter to the at least one of the plurality of partitions resynthesized;

(g) checking the at least one of the plurality of partitions resynthesized using binary decision diagram (BDD) partitioning;

(h) repeating steps (d)–(g) until a final verification result is determined for the at least one of the plurality of partitions; and (i) repeating steps (d)–(h) for all the plurality of partitions of the pair of combinational circuits.

37. The computer-implemented method of claim 36, further comprising the step of applying a functional filter to the circuit data structures prior to performing the simulating step.

38. The computer-implemented method of claim 37, further comprising the step of applying a structural filter to the circuit data structures prior to applying the functional filter.

39. The computer-implemented method of claim 38, further comprising the step of performing targeted decomposition of the circuit data structures prior to applying the structural filter.

40. The computer-implemented method of claim 36, wherein the step of applying the macro-filter comprises the steps of performing the smart cutset based verification technique followed by the automatic test pattern generation technique and repeating performance of the smart cutset based verification technique and the automatic test pattern generation technique until a final verification result is determined for the at least one of the plurality of partitions.

41. The computer-implemented method of claim 36, wherein the pruning step comprises the steps of:

associating, for each gate in the pair of combinational circuits, corresponding primary outputs that each gate affects;

applying random pattern simulation to determine a signature of each gate for a set of applied random simulation vectors; and assigning each pair of gates which has either the same or the complement signature and whose output lists intersect, to a group for subsequent checking of functional equivalence or functional complement.

42. A system for verifying a combinational circuit represented by a circuit data structure comprising:

means for executing a plurality of complete verification techniques and a plurality of supporting techniques arranged in a sequence for the combinational circuit, each of the plurality of complete verification techniques being capable of determining a verification result and each of the plurality of supporting techniques being capable of altering the circuit data structure, for passing the verification result to one of subsequent complete verification techniques in the sequence, for passing the altered circuit data structure to one of subsequent supporting techniques in the sequence, and for providing a final verification result.

43. The system of claim 42, wherein the executing means executes the plurality of complete verification techniques and supporting techniques until a predetermined set of constraints on computer memory usage are exceeded.

44. The system of claim 42, wherein the executing means executes the plurality of complete verification techniques and supporting techniques until a predetermined set of constraints on computer execution time usage are exceeded.

45. The system of claim 42, wherein the executing means executes the plurality of complete verification techniques and supporting techniques until the final verification result is determined.

46. A system for analyzing a combinational circuit represented by a circuit data structure comprising:

means for executing a plurality of complete analysis techniques and a plurality of supporting techniques arranged in a sequence for the combinational circuit, each of the plurality of complete verification techniques being capable of determining an analysis result and each of the plurality of supporting techniques being capable of altering the circuit data structure, for passing the analysis result to one of subsequent complete analysis techniques in the sequence, for passing the altered circuit data structure to one of the supporting techniques in the sequence, and for providing a final analysis result.

47. The system of claim 46, wherein the executing means executes the complete analysis techniques and supporting techniques until a predetermined set of constraints on computer memory usage, computer execution time usage, or number of backtracks when at least one of the complete analysis techniques is an automatic test pattern generation technique, are exceeded.

48. The system of claim 46, wherein the executing means further comprises means for determining existence or absence of a fault in the combinational circuit.

49. The system of claim 46, wherein the executing means executes the complete analysis techniques and supporting techniques until the final analysis result is determined.

50. The system of claim 46, wherein the executing means further comprises means for determining timing constraints of the combinational circuit.

51. The system of claim 46, wherein the executing means further comprises means for determining minimum cost engineering change solutions for the combinational circuit.

52. The system of claim 46, wherein the executing means further comprises means for determining correctness of a sequential circuit.

* * * * *

UNITED STATES PATENT AND TRADEMARK OFFICE
CERTIFICATE OF CORRECTION

PATENT NO.  : 6,086,626
DATED       : July 11, 2000
INVENTOR(S) : Jawahar Jain, Rajarshi Mukherjee and Koichiro Takayama It is certified that error appears in the above-identified patent and that said Letters Patent is hereby corrected as shown below:

Column 20,
Lines 17 and 19, replace "techniques is" with -- techniques being -- (both occurrences).

Column 21,
Lines 3 and 5, replace "techniques is" with -- techniques being -- (both occurrences).

Column 22,
Line 10, after "wherein" insert -- each --.

Column 24,
Line 13, replace "assigning each pair of gates which has either" with -- assigning each gate as a pair that have either --.

Column 25,
Line 7, replace "assigning each pair of gates which has either" with -- assigning each gate as a pair that have either --.

Signed and Sealed this

Fifteenth Day of October, 2002

Attest:

JAMES E. ROGAN
Director of the United States Patent and Trademark Office

Attesting Officer